(12) United States Patent
Hijioka et al.

(10) Patent No.: US 9,159,618 B2
(45) Date of Patent: Oct. 13, 2015

(54) SEMICONDUCTOR DEVICE WITH CONTACTS AND METAL INTERCONNECTS AND METHOD OF MANUFACTURING THE SEMICONDUCTOR DEVICE

(71) Applicant: Renesas Electronics Corporation, Kawasaki-shi, Kanagawa (JP)

(72) Inventors: Kenichiro Hijioka, Kawasaki (JP); Naoya Inoue, Kawasaki (JP); Yoshihiro Hayashi, Kawasaki (JP)

(73) Assignee: Renesas Electronics Corporation, Kanagawa (JP)

( * ) Notice: Subject to any disclaimer, the term of this patent is extended or adjusted under 35 U.S.C. 154(b) by 45 days.

(21) Appl. No.: 13/652,944

(22) Filed: Oct. 16, 2012

(65) Prior Publication Data
US 2013/0092993 A1    Apr. 18, 2013

(30) Foreign Application Priority Data
Oct. 17, 2011    (JP) .................................. 2011-227650

(51) Int. Cl.
| | |
|---|---|
| H01L 29/94 | (2006.01) |
| H01L 21/768 | (2006.01) |
| H01L 27/02 | (2006.01) |
| H01L 27/108 | (2006.01) |
| H01L 49/02 | (2006.01) |

(52) U.S. Cl.
CPC ...... *H01L 21/76895* (2013.01); *H01L 27/0207* (2013.01); *H01L 27/10814* (2013.01); *H01L 27/10852* (2013.01); *H01L 27/10885* (2013.01); *H01L 27/10891* (2013.01); *H01L 27/10894* (2013.01); *H01L 28/91* (2013.01); *H01L 21/76807* (2013.01); *H01L 21/76816* (2013.01)

(58) Field of Classification Search
CPC ....................................................... H01L 21/02
USPC .......................................... 257/301; 438/386
See application file for complete search history.

(56) References Cited

U.S. PATENT DOCUMENTS

| | | | |
|---|---|---|---|
| 6,429,476 B2* | 8/2002 | Suzuki et al. | 257/296 |
| 6,501,119 B1 | 12/2002 | Ohno | |
| 6,617,631 B2* | 9/2003 | Huang | 257/296 |

(Continued)

FOREIGN PATENT DOCUMENTS

| | | |
|---|---|---|
| JP | 2000-164822 A | 6/2000 |
| JP | 2000-174268 A | 6/2000 |

(Continued)

*Primary Examiner* — Jarrett Stark
*Assistant Examiner* — Mohammad M Hoque
(74) *Attorney, Agent, or Firm* — Foley and Lardner LLP

(57) ABSTRACT

A semiconductor device includes a substrate, an interlayer insulation layer, first transistors, a multilayered interconnect layer, capacitance devices, metal interconnects, and first contacts. Interlayer insulation films are disposed over the substrate. The first transistors are disposed to the substrate and buried in the interlayer insulation layer. The first transistor has at least a gate electrode and a diffusion electrode. A multilayered interconnect layer is disposed over the interlayer insulation film. The capacitance devices are disposed in the multilayered interconnect layer. The metal interconnect is in contact with the upper surface of the gate electrode and buried in the interlayer insulation layer. The first contact is coupled to the diffusion layer of the first transistor and buried in the interlayer insulation layer. The metal interconnect includes a material identical with that of the first contact.

7 Claims, 19 Drawing Sheets

(56) References Cited

U.S. PATENT DOCUMENTS

| | | | |
|---|---|---|---|
| 6,656,785 B2* | 12/2003 | Chiang et al. | 438/240 |
| 6,798,006 B2* | 9/2004 | Amo et al. | 257/296 |
| 7,986,012 B2 | 7/2011 | Matsubara et al. | |
| 8,089,161 B2* | 1/2012 | Komuro | 257/774 |
| 8,252,641 B2* | 8/2012 | Aoki | 438/210 |
| 8,390,046 B2* | 3/2013 | Kawahara et al. | 257/296 |
| 8,653,666 B2* | 2/2014 | Kawakita | 257/758 |
| 2002/0182847 A1* | 12/2002 | Yokoyama et al. | 438/622 |
| 2003/0058708 A1* | 3/2003 | Weber | 365/200 |
| 2003/0087491 A1* | 5/2003 | Jeong | 438/244 |
| 2004/0164339 A1* | 8/2004 | Felsner et al. | 257/307 |
| 2004/0201053 A1* | 10/2004 | Tu et al. | 257/296 |
| 2005/0124132 A1* | 6/2005 | Tu | 438/396 |
| 2006/0094186 A1* | 5/2006 | Mitani | 438/253 |
| 2009/0159978 A1* | 6/2009 | Matsubara et al. | 257/368 |
| 2010/0102371 A1* | 4/2010 | Yeom | 257/296 |
| 2010/0123199 A1* | 5/2010 | Kawahara et al. | 257/379 |
| 2011/0049600 A1* | 3/2011 | Aoki | 257/303 |
| 2011/0183488 A1* | 7/2011 | Takaishi | 438/381 |
| 2012/0322225 A1* | 12/2012 | Schloesser et al. | 438/397 |

FOREIGN PATENT DOCUMENTS

| | | |
|---|---|---|
| JP | 2004-342787 A | 12/2004 |
| JP | 2009-105149 A | 5/2009 |
| JP | 2009-158591 A | 7/2009 |
| JP | 2011-54920 A | 3/2011 |

* cited by examiner

SEMICONDUCTOR DEVICE WITH CONTACTS AND METAL INTERCONNECTS AND METHOD OF MANUFACTURING THE SEMICONDUCTOR DEVICE

CROSS-REFERENCE TO RELATED SPECIFICATIONS

The disclosure of Japanese Patent Application No. 2011-227650 filed on Oct. 17, 2011 including the specification, drawings, and abstract is incorporated herein by reference in its entirety.

BACKGROUND

This invention concerns a semiconductor device and a method of manufacturing the semiconductor device.

In the field of semiconductor devices, reduction in the size and increase in the speed of semiconductor device have been demanded. Semiconductor devices that can reduce the size and increase the speed include, for example, those described in Japanese Unexamined Patent Publication No. 2011-54920.

The semiconductor device described in Japanese Unexamined Patent Publication No. 2011-54920 has a hybrid circuit in which a logic circuit and a memory circuit are hybridized on one identical substrate. Capacitance devices forming a memory circuit are buried in a layer common with a multilayered wiring layer forming a logic circuit. An upper interconnect layer is formed over the capacitance devices. The interconnect of the upper interconnect layer (fifth layer interconnect 55) is utilized as a word line backing interconnect (column 0123 in Japanese Unexamined Patent Publication No. 2011-549920). The word line backing interconnect decreases the resistance of a word line.

Further, Japanese Unexamined Patent Publication No. 2009-105149 describes a semiconductor device in which bit lines are disposed in a layer over the capacitance devices. The bit line is coupled electrically by way of a contact with a diffusion layer of a transistor. The contact is disposed between each of the capacitance devices in adjacent to them.

SUMMARY

The method of manufacturing a semiconductor device described in Japanese Unexamined Patent Publication No. 2011-54920 utilizes the interconnect layer (in the layer) over the capacitance device as the word line backing interconnect. Accordingly, the degree of freedom for the design of the interconnect layer (in the layer) over the capacitance devices is lowered since this is on the premise of using the upper layer interconnect as the word line backing interconnect.

The present invention provides a semiconductor device which includes: a substrate; an interlayer insulation layer disposed over the substrate; first transistors disposed over the substrate and buried in the interlayer insulation layer; a multilayered interconnect layer disposed over the interlayer insulation layer; capacitance devices disposed in the multilayered interconnect layer; a gate electrode and a diffusion layer of each of the first transistor; a metal interconnect in contact with the upper surface of the gate electrode, extended in a direction identical with the gate electrode, and buried in the interlayer insulation layer; and first contacts coupled to the diffusion layer of the first transistor and buried in the interlayer insulation layer, in which the metal interconnect includes a material identical with that of the first contact.

The metal interconnect decreases the resistance of the gate electrode. The metal interconnect is buried in the interlayer insulation layer in the layer below the capacitance device. Accordingly, since the design for the interconnect layer (in the layer) over the capacitance device is not restricted by the utilization of the metal interconnect, the degree of freedom is improved.

Further, the present invention provides a method of manufacturing a semiconductor device which includes: forming first transistors each having a gate electrode and a first diffusion layer to a substrate; forming an interlayer insulation layer over the first transistors; forming interconnect trenches extended in a direction identical with that of the gate electrode to the interconnect insulation layer over the gate electrode and forming first contact holes for burying a contact in the interlayer insulation layer over the first diffusion layer; burying an identical metal layer in the interconnect trenches and in the first contact holes; forming an insulation layer over the first interlayer insulation layer; and burying capacitance devices in the insulation layer.

The present invention provides a semiconductor device excellent in the degree of freedom for the design of the interconnect layer over the capacitance device.

DETAILED DESCRIPTION

Embodiments of the invention are to be described with reference to the drawings. Throughout the drawings, identical constituent elements have identical references for which duplicate descriptions are optionally omitted.

First Embodiment

Figure 1:
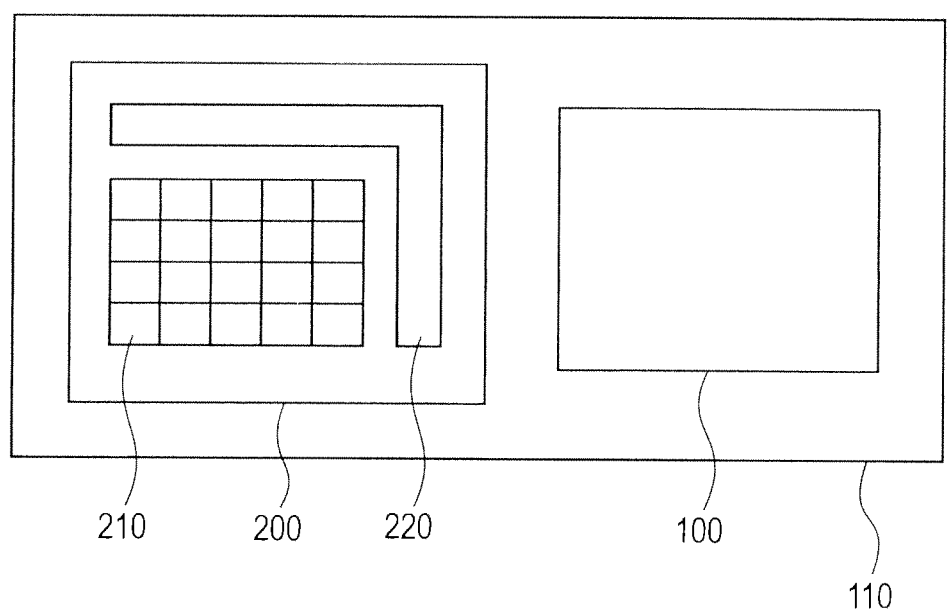
FIG. 1 is an upper plan view schematically showing a semiconductor device of a first embodiment.
Figure 2:
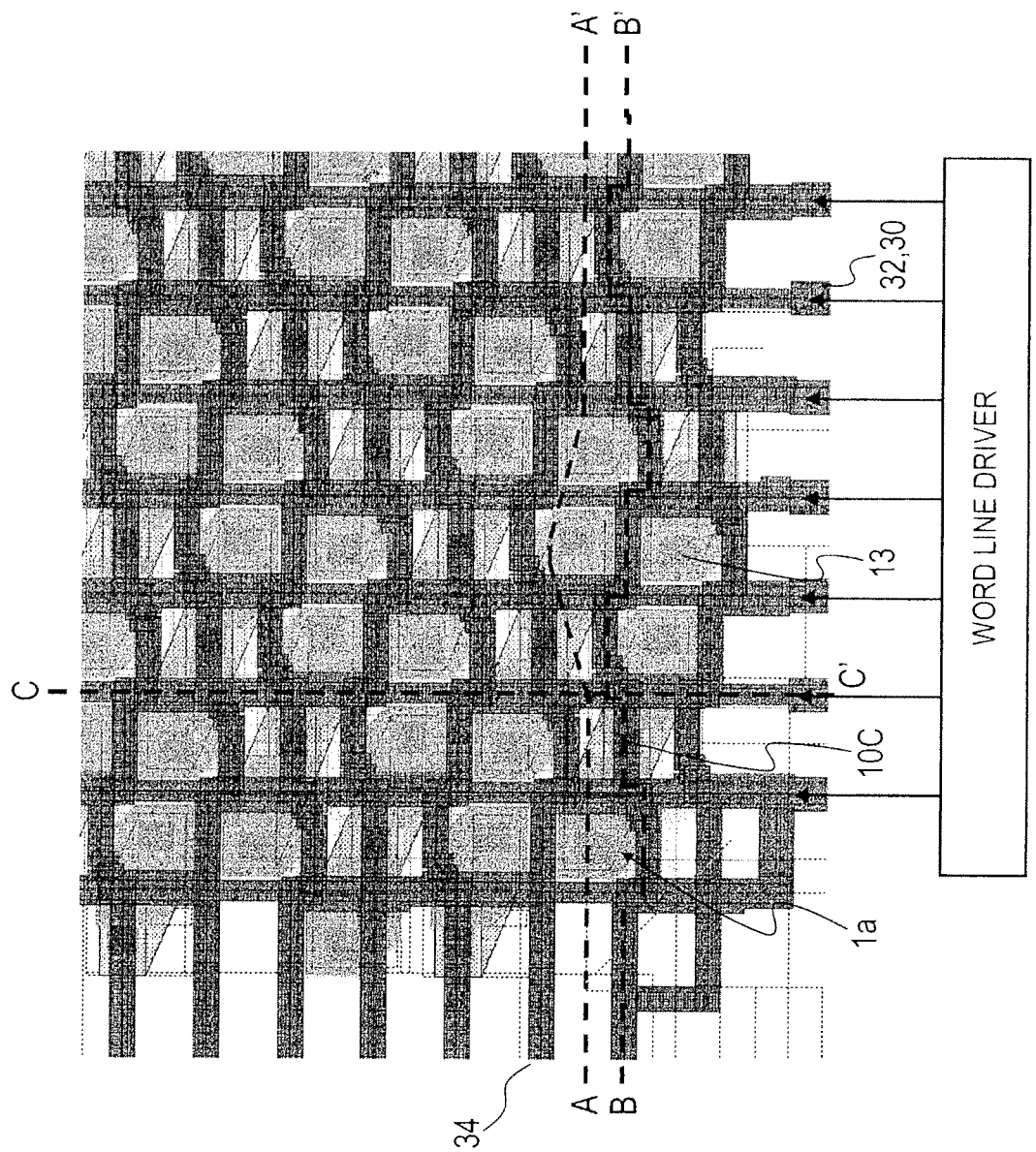
FIG. 2 is an upper plan view schematically showing the periphery of a memory device of the first embodiment.
Figure 3:
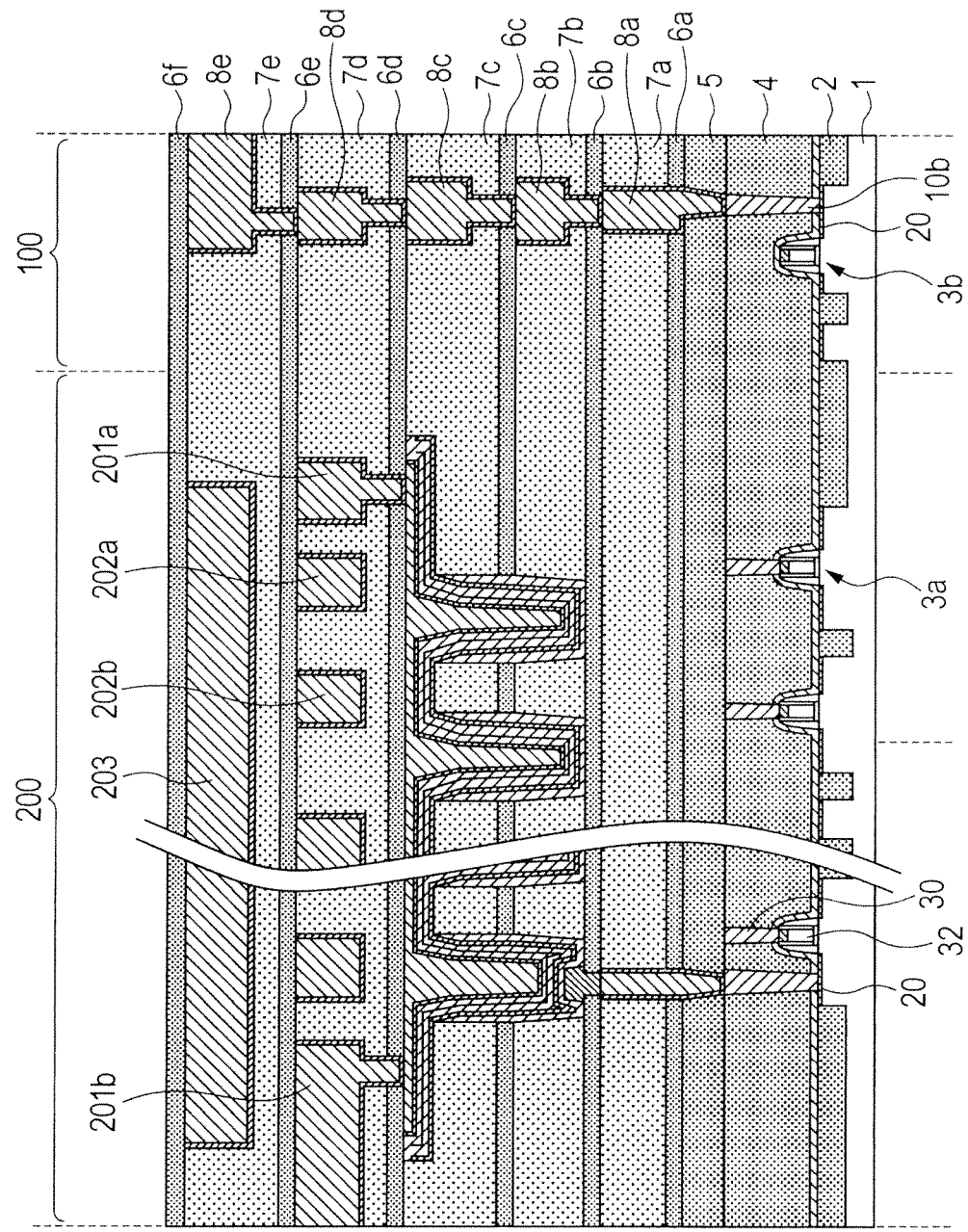
FIG. 3 is a cross sectional view along line A-A' in FIG. 2.
Figure 4:
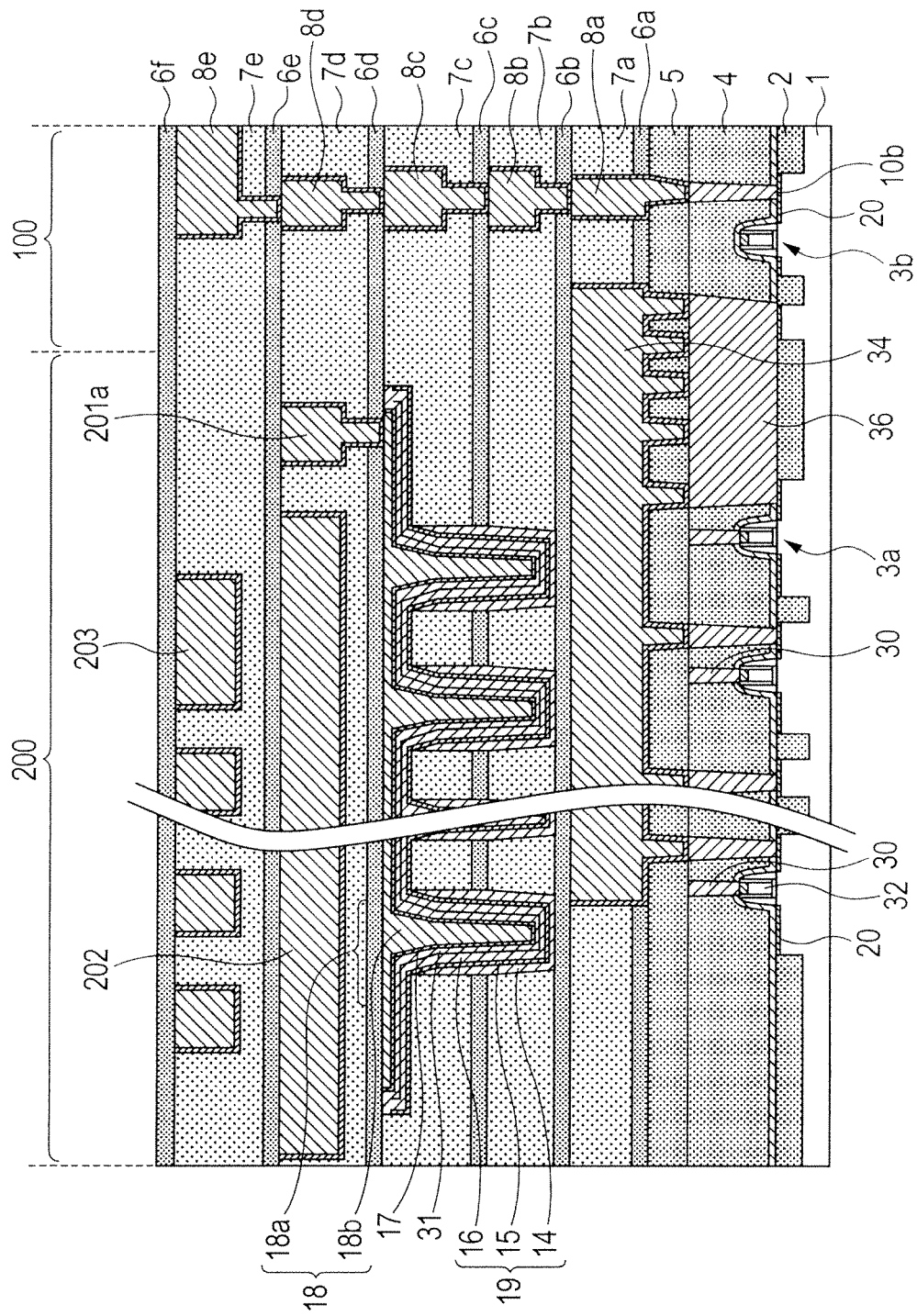
FIG. 4 is a cross sectional view along line B-B' in FIG. 2.
Figure 5:
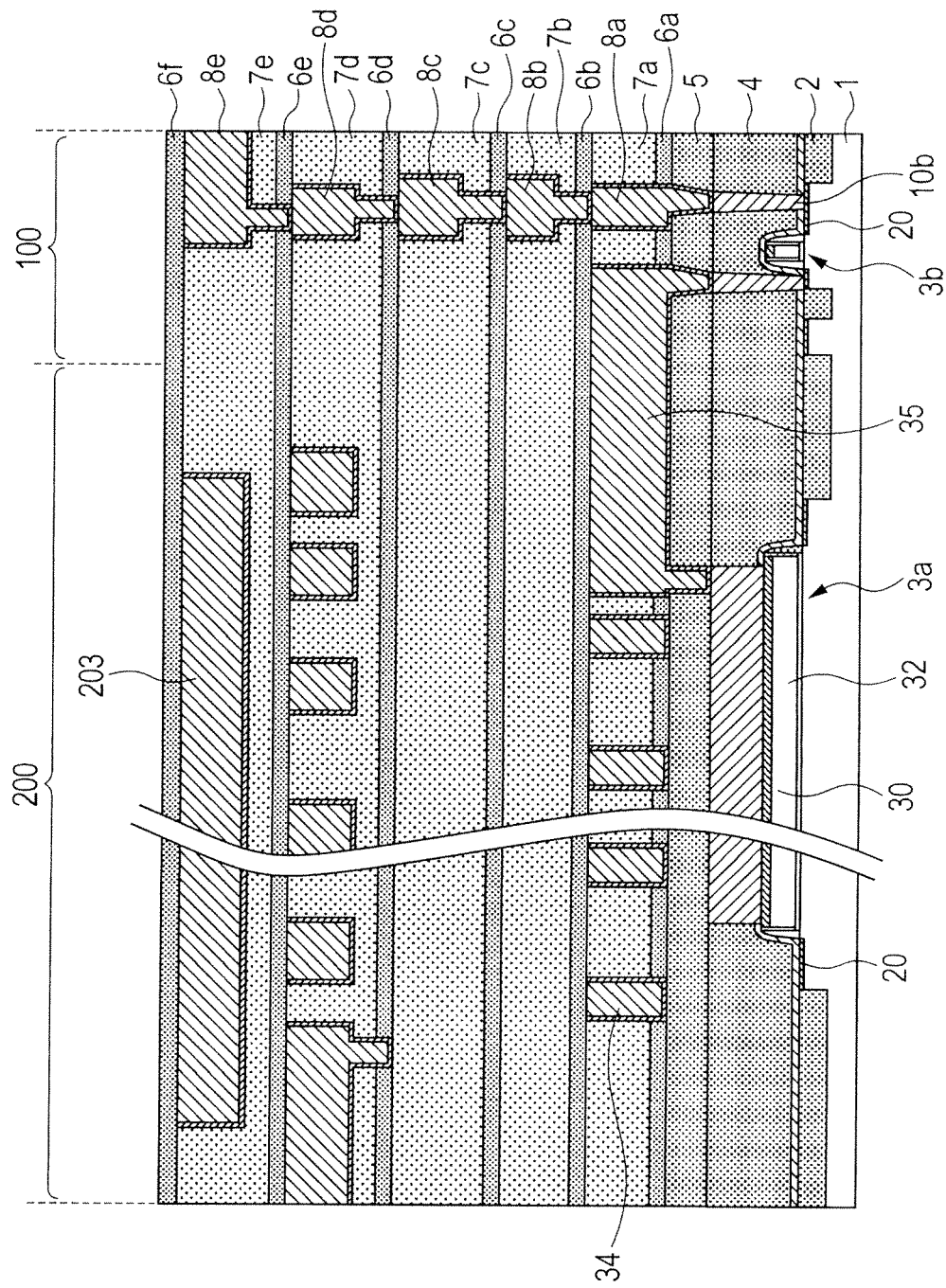
FIG. 5 is a cross sectional view along line C-C' in FIG. 2.

A semiconductor device of a first embodiment is to be described. FIG. 1 and FIG. 2 are plan views schematically showing a semiconductor device of the first embodiment. FIG. 3 to FIG. 5 show a cross sectional view along line A-A', a cross sectional view along line B-B', and a cross sectional view along line C-C' shown in FIG. 2.

The semiconductor device of this embodiment has a substrate, an interlayer insulation layer, first transistors, a multilayered interconnect layer, capacitance devices, a metal interconnect, and first contacts. An interlayer insulation layer (contact interlayer insulation films 4, 5) is disposed over a substrate (semiconductor substrate 1). Each of the first transistors (active device 3a) is disposed to the semiconductor substrate 1 and buried in the interlayer insulation layer. The first transistor has at least a gate electrode (gate electrode 32) and a diffusion layer. A multilayered interconnect layer is disposed over the interlayer insulation layer. Each of the capacitances device 19 is disposed in the multilayered interconnect. A metal interconnect (gate backing interconnect 30) is in contact with the upper surface of the gate electrode 32, extended in a direction identical with that of the gate electrode 32, and buried in the interlayer insulation layer (contact interlayer insulation film 4). Each of the first contacts (cell contact 10a) is coupled to the diffusion layer (not illustrated) of the first transistor (active device 3a), and buried in the interlayer insulation layer (contact interlayer insulation film 4). In this embodiment, the metal interconnect (gate backing interconnect 30) includes a material identical with that of the first contact (cell contact 10a).

The gate backing interconnect 30 in this embodiment is formed not to the interconnect layer in a layer over the capacitance device 19 but in a layer below the capacitance device 19. Accordingly, since the design for the interconnect layer over the capacitance device 19 is not restricted by the utilization of the gate backing interconnect 30, the degree of freedom is improved. Further, by forming the gate backing interconnect 30, the resistance of the word line (gate electrode 32) can be lowered.

Each of the configurations of this embodiment is to be described specifically.

The semiconductor device of this embodiment is applicable to both of embedded DRAM (Dynamic Random Access Memory) and general-purpose DRAM. FIG. 1 shows a semiconductor device of an embedded DRAM. The semiconductor device has a memory circuit and a logic circuit on one identical substrate. That is, as shown in FIG. 1, a memory circuit 200 including capacitance devices 210 and a logic circuit 100 in which semiconductor devices are formed are hybridized on a semiconductor substrate 110. The logic circuit 100 is formed not in a peripheral circuit 220 of the capacitance devices 210 in the memory circuit 200 but in a region different from the memory circuit 200. For example, the logic circuit region is a region in which a high speed logic circuit such as CPU (Central Processing Unit) or the like is formed. The general-purpose DRAM has a memory circuit but has no logic circuit.

FIG. 2 shows an example of a layout of the memory circuit 200. The memory circuit 200 includes capacitance devices 19, gate electrodes 32, and bit lines 34. Two capacitance devices 19 are formed over a hexagonal diffusion layer. The capacitance device 19 is coupled by way of a capacitance contact 13 (capacitance device coupling contact) to the diffusion layer. The gate electrode 32 is formed for a plurality of diffusion layers. Bit lines 34 are formed in a direction substantially crossing the gate backing interconnects 30. The bit line 34 is coupled by way of a cell contact 10c (bit line coupling contact) to the diffusion layer.

In FIG. 2, a line A-A' is a line traversing the capacitance devices 19 but not traversing the bit lines 34. A line B-B' is a line traversing the bit line 34. The line C-C' is a line traversing the gate electrodes 32 but not traversing the bit lines 34.

A device isolation film 2 is formed to the surface of the semiconductor substrate 1. The device isolation film 2 isolates the memory circuit region and the logic circuit region. A memory circuit 200 is formed in a memory circuit region. A logic circuit 100 is formed in a logic circuit region. The memory circuit 200 has active devices 3a. The logic circuit 100 has active devices 3b. The active devices 3a and 3b are, for example, transistors. The device isolation film 2 includes, for example, a silicon oxide film.

A contact interlayer insulation film 4 is formed over the semiconductor substrate 1. In the contact interlayer insulation film 4, active devices 3a and 3b, gate backing interconnects 30, cell contacts 10a, 10b and 10c, and bit contacts 36 are buried.

The transistor (active device 3a or 3b) has a diffusion layer formed to the surface layer of the substrate (source-drain region), a gate insulation film, and a gate electrode 32 disposed over the substrate. The gate electrode 32 is not particularly restricted and may be either a polysilicon electrode or a metal electrode. A metal layer, for example, of TiN may be formed over the polysilicon electrode. The gate electrode is generally referred to as a metal gate. Further, the gate electrode may also include a material containing a metal, for example, nickel, platinum, cobalt, zirconium, tungsten, titanium, hafnium, tantalum, aluminum, ruthenium, and palladium. As described above, the metal electrode and the metal layer may include a plurality of kinds of stacked metal films but may also include a single metal layer. In this embodiment, a silicide layer 20 may be formed to the surface layer of the diffusion layer.

A gate backing interconnect 30 is formed over the gate electrode 32 situated in the memory circuit region. The gate backing interconnect 30 include a material different from that of the gate electrode 32, and buried in the interlayer insulation layer (contact interlayer insulation film 4) identical with that of the gate electrode 32. The gate backing interconnect 30 is preferably formed at least overriding the source-drain diffusion layers of an identical transistor. The lower surface of the gate backing interconnect 30 may be entirely or partially in contact with the upper surface of the gate electrode 32. The upper surface of the gate backing interconnect 30 may form a surface identical with the upper surface of the contact interlayer insulation film 4.

In this embodiment, the identical surface means a plane in which the maximum value of the scattering of the concavo-convex height relative to the average height of the surface is preferably 30 nm or less, more preferably, 20 nm or less and, further preferably, 10 nm or less when measured by the following measuring method. The measuring method includes, for example, a method of obtaining a cross sectional image including the upper surface of the upper coupling interconnect 18 and the upper surface of the interconnect 8b by using SEM (Scanning Electron Microscope) or TEM (Transmission Electron Microscope) and measuring the scattering of the height of the step based on the cross sectional image, and a method of measuring the profile for the height in the direction of a plane by a step gauge used generally for the inspection step in the production process of semiconductor devices.

The gate backing interconnect 30 preferably includes a material identical with that of the cell contact 10a coupled to the diffusion layer of the active device 3a. The gate backing interconnect 30 preferably includes, for example, a metal material containing one of W, Cu, Al, etc. and preferably includes a metal material containing W as a main ingredient or including W. In this embodiment, "material identical with - - -" means that the composition of ingredients is identical or main ingredients are identical. Further, "containing - - - as a main ingredient" in this embodiment means that the ingredient is contained, for example, by 90 mass % or more.

Since the gate backing interconnect 30 includes a material identical with that of the cell contact 10a, the gate backing interconnect 30 and the cell contact 10a are formed by an identical step. Therefore, the manufacturing process can be simplified. Further, since the gate backing interconnect 30 includes a metal material containing W, the metal ingredient of the gate backing interconnect 30 can be prevented from diffusing into the interlayer insulation film.

The gate backing interconnect 30 may include a material identical with that of a cell contact 10b coupled to the diffusion layer of the active device 3b. The active device 3b (second transistor) is disposed to the semiconductor substrate 1 and situated in the logic circuit region which is a region different from the memory circuit region including the first transistor (active device 3a). A second connect (cell contact 10b) couples the active device 3b and the first interconnect. The first interconnect is situated to the lowermost interconnect layer of the multilayered interconnect layer situated in the logic circuit region. In this embodiment, the gate backing interconnect 30 is formed in the layer identical with that of the cell contact 10a in the region of the memory circuit 200 and the cell contact 10b in the region of the logic circuit 100. Further, the gate backing interconnect 30 includes a material identical with that of the cell contact 10a and the cell contact 10b.

A bit contact 36 may be formed overriding two diffusion layers isolated by the device isolation film. The bit contact 36 may be extended in one direction along the device mounting surface.

A contact interlayer insulation film 5, a cap film 6a, and an interlayer insulation film 7a are formed over the contact interlayer insulation film 4. An interconnect 8a, a bit line 34, an interconnect 35, and a capacitance contact 13a are buried in the layers. That is, the bit line 34 and the capacitance contact 13a are formed in a layer identical with that of the interconnect 8a of the lowermost interconnect. The bit line 34 and the capacitance contact 13a are situated in the region of the memory circuit 200. The interconnect 8a is situated in the region of the logic circuit 100. In this embodiment, a barrier metal film is formed along the lateral surface and the bottom of the interconnect 8a, the bit line 34, and the capacitance contact 13a, and a metal film is buried inside thereof.

A silicon oxide film may be used to at least one layer of the contact interlayer insulation films 4 and 5 and an insulation film having a specific dielectric constant lower than that of the silicon oxide film is more preferred. For the insulation film, an insulation film generally referred to as a low dielectric constant film in which oxygen atoms in the silicon oxide film are substituted with fluorine or carbon atoms and hydrocarbon groups, or a so-called porous film at least having silicon, oxygen, and carbon and containing fine pores with a diameter of several nanometers or less in the insulation film may also be used. The specific dielectric constant of the insulation films is preferably 3.1 or less in a case of an insulation film not having fine pores in the film and, more preferably, 2.6 or less in a case of an insulation film having fine pores in the film. With such a structure, the parasitic capacitors of the contact can be decreased and, as a result, delay in the memory circuit and the logic circuit can be decreased to improve the operation speed of a semiconductor device.

The bit line 34 is coupled by way of a cell contact 10c or the bit contact 36 to the diffusion layer of the active device 3a. The upper surface of the bit line 34 may fault a plane identical with the upper surface of the interconnect 8a. Further, the bit line 34 preferably include a material identical with that of the interconnect 8a. The bit line 34 preferably includes a metal film containing, for example, one of W, Cu, and Al and preferably includes a metal film containing Cu as a main ingredient or a metal film including Cu.

Since the bit line 34 is formed in the step identical with that of the interconnect 8a, the manufacturing process can be simplified. Further, when the bit line 34 and the interconnect 8a include a metal film containing Cu, the operation speed of the semiconductor device can be improved further than in the case of using W.

In this embodiment, the bit line 34 can be formed in a layer identical with that of the lowermost interconnect (interconnect 8a). Therefore, it not necessary to form a contact layer between the interconnect 8a and the cell contact 10b in the region of the logic circuit 100. The parasitic resistance is decreased and the operation speed of the semiconductor device can be increased by so much as the contact layer is not necessary in the direction of the interlayer in the region of the logic circuit 100. Accordingly, the e-DRAM in this embodiment can be designed by using device parameters identical with those of pure logic products.

Further, the bit line 34 can be formed in the layer below the capacitance device 19 of the region of the memory circuit 200 by utilizing the interconnect of the logic circuit 100. That is, the bit line 34 can includes the material identical with that of the interconnect 8a, or the upper surface of the bit line 34 and the upper surface of the lowermost interconnect (interconnect 8a) can be formed as an identical surface. Accordingly, when the interconnect 8a is formed under planarization, the planarity of the interlayer insulation film 7a in the region of the memory circuit is improved. Therefore, since scattering of the height of the capacitance device 19 situated over the interlayer insulation film 7a in the memory circuit region can be suppressed, scattering of the capacitance can be decreased.

The capacitance contact 13b preferably include a material identical with that of the bit line 34 and the interconnect 8a.

A signal is inputted to the gate backing interconnect 30 from a word line driver situated outside of a cell array. FIG. 2 shows an enlarged view for the end of the cell array. For example, as shown in FIG. 5, the gate backing interconnect 30 is electrically coupled with the active device 3b situated in the logic circuit 100 by way of an interconnect 35. The interconnect 35 is coupled to the gate backing interconnect 30 and the cell contact 10b by way of via holes. The interconnect 35 is preferably formed by a step identical with that of the interconnect 8a. That is, the interconnect 35 can be made of a material identical with that of the interconnect 8a.

A cap film 6b is formed over the upper surface of the bit lines 34. The cap film 6b may also have a metal diffusion preventive film. Thus, even when the bit line 34 includes a metal material containing Cu, the cap film 6b can prevent diffusion of Cu into the interlayer insulation layer.

An interlayer insulation film 7b, a cap film 6c, an interlayer insulation film 7c, and a cap film 6d are formed over the cap film 6b. The capacitance device 19, the capacitance contact 13, and interconnects 8b and 8c are formed in the layers.

The capacitance device 19 includes a lower electrode 14, a capacitance dielectric film 15, and an upper electrode 16. The capacitance device 19 is buried in a concave portion formed in the multilayered interconnect layer (hereinafter referred to as a concave portion for burying capacitance device). The capacitance device 19 is formed for two layers of interlayer insulation films, but this embodiment is not restrictive and the capacitance device may be formed for three or more layers.

The lower electrode 14 and the upper electrode 16 function as electrodes that sandwich the capacitance dielectric film to form a parallel plate capacitance device. The lower electrode 14 and the upper electrode 16 are preferably formed of a material including a high melting metal such as titanium or tantalum, or nitrides thereof, and a material capable of improving the crystallinity of the capacitance dielectric film 15 is used preferably.

As the material of the capacitance dielectric film 15, it is more preferred that the film has higher specific dielectric constant than a silicon nitride film, for example, a film of zirconium dioxide ($ZrO_2$), zirconium aluminate ($ZrAlO_x$) and, further, a film with addition of lanthanoid such as Tb, Er, Yb, etc. to zirconium dioxide. The static capacitance of the capacitance device 19 can be increased by increasing the specific dielectric constant of the capacitance dielectric film 15.

The lower electrode 14, the capacitance dielectric film 15, and the upper electrode 16 are stacked along the bottom and the side walls of the concave portion for burying a capacitance device. In this embodiment, a buried electrode 18b is buried in the concave portion for burying the capacitance device in other portions than the portion where the lower electrode 14, the capacitance dielectric film 15, and the upper electrode 16 are buried. A lead interconnect 18a is formed over the buried electrode 18b. The lead interconnect 18a is formed in an interconnect trench extended continuously to the outside at the upper end of the concave portion for burying the capacitance device (hereinafter referred to as an upper interconnect trench). In this embodiment, the buried electrode 18b and the lead interconnect portion 18a are formed of the identical material and by one identical step.

The capacitance device 19 and the active device 3a are coupled by the capacitance contact 13. The capacitance contact 13 includes a cell contact 10a, a capacitance contact 13a, and a capacitance contact 13b. That is, the capacitance contact 13 has at least three or more contacts arranged in the interlayer direction. Among the three contacts, at least the intermediate contact may include a material different from that of the contacts on the ends. For example, the intermediate contact includes a Cu-containing metal and the contacts at the ends include a W-containing metal. The capacitance contact 13a is coupled by way of the cell contact 10a to the diffusion layer of the active device 3a. The capacitance contact 13b electrically couples the lower electrode 14 and the capacitance contact 13a.

The lower end of the capacitance device 19 covers the capacitance contact 13b. The capacitance contact 13b has an upper end situated in the interlayer insulation film 7b identical with the lower end of the capacitance device 19. The lower electrode 14 of the capacitance device 19 covers the upper surface and at least the upper portion of the side wall of the capacitance contact 13b. In other words, the capacitance contact 13b has a protrusion protruding upward from the upper surface of the cap film 6b and a via portion for coupling the protrusion and the capacitance contact 13a. For example, this embodiment, the entire surface of the protrusion of the capacitance contact 13b is covered only by the lower electrode 14.

In this embodiment, the electrode area of the capacitance device 19 can be increased to improve the static capacitance since the protrusion of the capacitance contact 13b is covered by the lower electrode 14.

In this embodiment, a hard mask 31 and a barrier metal film 17 may be formed between the upper electrode 16 and the buried electrode 18b. Further, the capacitance devices 19 adjacent to each other may use the capacitance dielectric film 15 and the upper electrode 16 in common. That is, the capacitance dielectric film 15 and the upper electrode 16 may be formed continuously for the inner wall of the concave portions for burying the capacitance devices adjacent to each other and the upper connect trench. Further, a side wall protective layer may be formed on the side wall of the capacitance device 19 relative to the interlayer insulation film. The side wall protective layer is a film which is denser than the interlayer insulation film. Accordingly, an advantageous effect of decreasing the leak current between the layer electrodes 14 of the adjacent capacitance devices 19 and improving the reliability for long time insulation can be obtained.

The material for the interlayer insulation film may be a usual insulation film of low dielectric constant containing fluorine, carbon, etc. in a silicon oxide film, or a so-called porous film in which fine pores are formed in the insulation film. In this embodiment, the interlayer insulation films 7a to 7e in which the interconnects are buried preferably include a film of low dielectric constant. As the interlayer insulation layer, an insulative material containing Si and containing at least one element selected from C, O, and H, or a material using the constituent elements described above, and containing pores in the film is used. For the insulative material used herein, the pore size is desirably small so that gaseous starting materials used for depositing the metal electrode or the capacitance dielectric film in the step of forming the capacitance device to be formed subsequently do not penetrate into the film. Since most of gaseous starting materials have a size of 0.5 to 1 nm, it is necessary that the pore size is 1 nm or less and, preferably, 0.5 nm or less. The specific dielectric constant of the interlayer insulation layer is more preferably lower than that of a silicon oxide film in order to decrease the parasitic capacitance between the interconnects. This is not restrictive only to the logic circuit 100 or the memory circuit 200. Thus, the parasitic capacitance between the interconnects can be decreased to decrease the delay of the circuit operation. Further, among the interlayer insulation layers, all of the interlayer insulation layers in the layer identical with the capacitance device 19 may preferably include a film of low dielectric constant. For example, it is preferred that all of insulation layers of a plurality of the interconnect layers in the layer identical with the capacitance device 19 are insulation layers having a lower specific dielectric constant than that of the silicon oxide film. This can decrease the parasitic capacitance between the interconnects and between the contacts and can increase the operation speed of the semiconductor device.

It is more preferred that the cap layer is an insulation film including silicon, carbon, or nitrogen, or having a stacked structure of films containing them, and a film having diffusion resistance to metals (metal diffusion preventive film) is more preferred. An example of the cap layer is a SiC film or SiON film and a SiCN film, or a stacked film thereof.

Interconnects 8*a* to 8*c* are formed more preferably by a dual damascene method used usually as a method of forming a multilayered interconnect in the semiconductor device. This can decrease the manufacturing cost of the interconnect and can decrease the resistance of the via portion coupling an interconnect and other interconnect present in different layers. In the interconnects 8*b* and 8*c* shown in FIG. 3, reference numerals are attached to them also including via portions used for coupling to interconnects 8*a*, 8*b* for the respective lower layers. That is, in this embodiment, the interconnect formed by the damascene method includes a via portion unless otherwise specified expressively. Then, a barrier metal film is formed at the periphery of each of the interconnects 8*a* to 8*c*. In this embodiment, it is preferred that all of the interconnects have a dual damascene structure. The barrier metal film is, for example, a film of titanium, tantalum, ruthenium or nitrides or, further, a stacked film thereof.

Further, an interlayer insulation film 7*d*, a cap layer 6*e*, an interlayer insulation film 7*e*, and a cap layer 6*f* are formed over the cap film 6*d*. Interconnects 201*a*, 201*b* having a fixed potential, global bit interconnects 202 such as signal interconnects 202*a* and 202*b*, a power source-ground interconnect 203, and interconnects 8*d* and 8*e* are formed over the cap film 6*d*. In this embodiment, the interconnect layer over the capacitance device 19 is utilized as a functional interconnect such as the global bit interconnect 202 other than the gate backing interconnect.

The function and the effect of the first embodiment are to be described below. In the first embodiment, the contact layer for coupling the interconnect in the lowermost layer and the cell contact 10*b* is not necessary in the logic circuit region. In this case, since the multilayered interconnect layer in the logic circuit region is lowered by one step, a resource is insufficient by one interconnect layer in the design of the memory circuit region.

In this regard, the gate backing interconnect can be formed over the gate electrode in this embodiment. Accordingly, the degree of freedom for the design of the layer over the capacitance device can be increased by so much as one interconnect layer. That is, the interconnect layer over the capacitance device can be utilized for other use than the gate backing interconnect. In other words, the metal interconnect layer used so far as the backing interconnect can be used as an interconnect forming the memory circuit.

Accordingly, in this embodiment, insufficiency of the resource of the interconnect layer can be supplemented by controlling the position of disposing the gate backing interconnect. Therefore, in this embodiment, the design for the logic circuit with no contact layer can be utilized as it is without increasing the interconnect layer.

Further, in this embodiment, the gate backing interconnect can be formed in a layer not over but below the capacitance device. Therefore, the contact for coupling the gate backing interconnect and the gate electrode from the lower layer to the upper layer of the capacitance device is not required. Further, in this embodiment, the bit line is also formed in a layer below the capacitance device. Accordingly, since it is not necessary to form the contact between each of the capacitance devices in the memory circuit region, the distance between the capacitance devices can be narrowed. This can increase the density of disposing the capacitance devices.

Then, a method of manufacturing a semiconductor device according to the first embodiment is to be described. FIGS. 6 to 17 are views showing the procedures of the method of manufacturing the semiconductor device according to the first embodiment. In FIG. 6 to FIG. 17, WL shows a cross sectional portion of the word line in the longitudinal direction, and BL shows a cross sectional portion of the bit line in the longitudinal direction. In the drawings, cross sectional views in multiple directions are contained in one drawing for the sake of easy explanation.

The method of manufacturing the semiconductor device of this embodiment includes the following steps. At first, first transistors (active devices 3*a*) each having a gate electrode 32 and a first diffusion layer are formed to a substrate (semiconductor substrate 1). Successively, an interlayer insulation layer (contact interlayer insulation film 4) is formed over the active devices 3*a*. Successively, an interconnect trench (backing interconnect trench 42) extended in the direction identical with the gate electrode 32 is formed in the contact interlayer insulation film over the gate electrode 32, and a first contact hole (contact hole 44) for burying a contact is formed in the contact interlayer insulation film 4 over the first diffusion layer. An identical metal layer (gate backing interconnect 30 and cell contact 10*a*) are buried in the backing interconnect trench 42 and the contact hole 44. Insulation layers (interlayer insulation films 7*b*, 7*c*) are formed over the contact interlayer insulation film 4. A capacitance device 19 is buried in the insulation layer. They are to be described more specifically.

Figure 6:
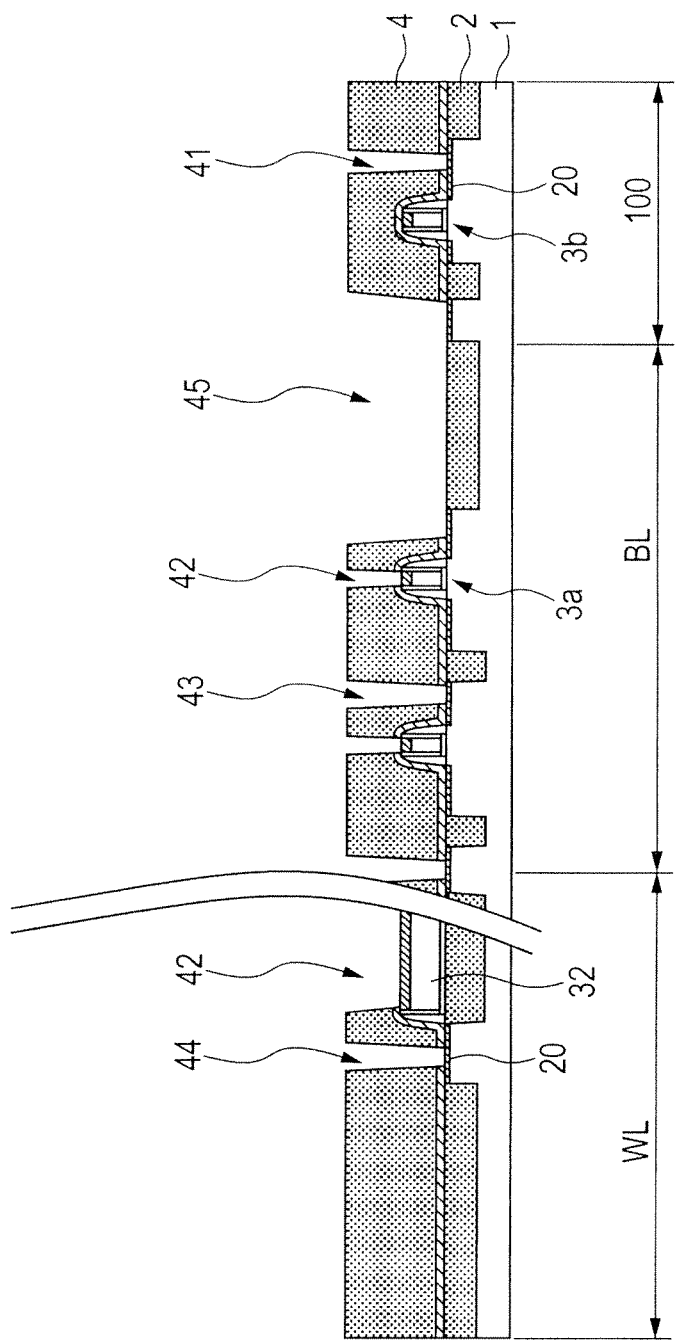
FIG. 6 is a cross sectional step view showing manufacturing procedures of a semiconductor device of the first embodiment.

At first as shown in FIG. 6, a device isolation film 2 is formed in the surface of the semiconductor substrate 1. Transistors such as active devices 3*a* and 3*b* are formed in a device region partitioned by the device isolation film 2. The transistor has a gate electrode and a diffusion layer. For the gate electrode, a polysilicon electrode used usually or a partially metal silicided polysilicon electrode may be used, or a metal gate electrode may be used. The method of forming the metal gate electrode includes, for example, a gate first method or a gate last method. Further, a silicide layer 20 may be formed on the diffusion layer. The silicide layer 20 includes, for example, an alloy of a metal such as cobalt, nickel or platinum and silicon.

A contact interlayer insulation film 4 is formed over the active devices 3*a* and 3*b*. Plural openings are formed by selectively removing the contact interlayer insulation film 4. For example, a photoresist is formed over the contact interlayer insulation film 4 by a coating method or the like and a desired pattern is transferred by a photolithography to form openings in the photoresist. Openings are formed in the contact interlayer insulation film 4 by a method, for example, of reactive ion etching by using a photoresist as a mask. Subsequently, the photoresist is removed. A method of forming the openings in the contact interlayer insulation film 4 is to be described specifically.

As a method of forming a plurality of openings in the photoresist of an identical layer, a double patterning method can be used for example in this embodiment. An example of the double patterning method is to be described. At first, a pattern of contact holes is formed to the photoresist over the diffusion layers of the transistors by first exposure. A pattern of a backing interconnect trench is formed to the photoresist over the gate electrode 32 by second exposure.

By successive patterning, even when the distance between the contact hole 44 and the backing interconnect trench 42 is short, lowering of resolution power by the interference of the exposure light can be suppressed. That is, a pattern for the contact holes 44 and the backing interconnect trenches 42 adjacent to each other can be obtained at a high accuracy by the double patterning method. The pattern for the backing interconnect trenches 42 can be formed previously.

For the exposure by the double patterning method, for example, a liquid immersion ArF (argon fluoride laser) exposure, EUV (Extreme Ultra Violet) exposure, EB (Electron Beam) exposure, etc. are used. In this embodiment, the distance between the contact hole 44 and the backing interconnect trench 42 can be shortened by shortening the wavelength in exposure and, further, making the exposure sequence for adjacent patterns different.

A plurality of openings are formed in the contact interlayer insulation film 4 by etching, etc. using a mask obtained by the double patterning method. That is, backing interconnect trenches 42, contact holes 41, 43 and 44, and a bit contact hole 45 are formed in the contact interlayer insulation film 4. Then, the hot resist is removed.

The contact holes 44, 43 situated in the memory circuit region may be formed at the same time with the contact hole 41 (second contact hole for burying the contact) situated in the logic circuit region. The contact hole 41 is formed in the interlayer insulation layer over the second diffusion layer of the second transistor (active device 3b). Further, a bit contact hole 45 may also be formed at the same time with the contact holes 41, 43, and 44.

Figure 7:
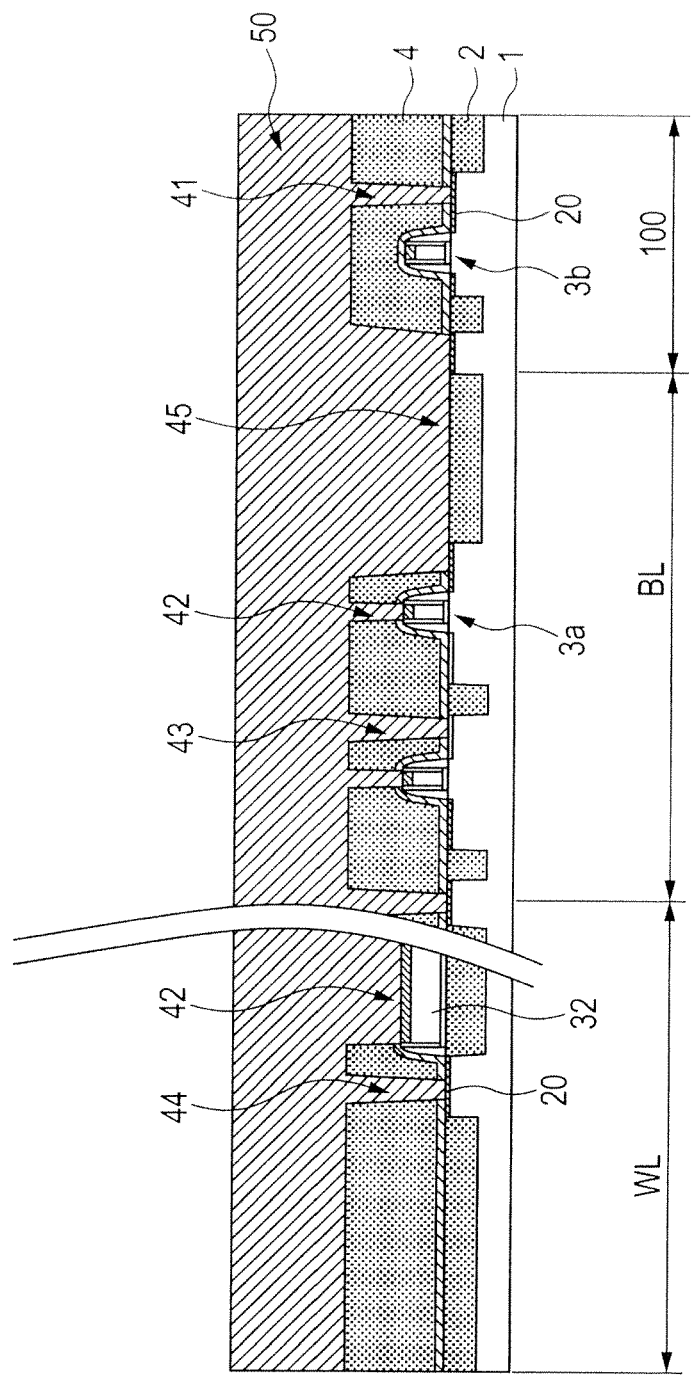
FIG. 7 is a cross sectional step view showing manufacturing procedures of the semiconductor device of the first embodiment.

Successively, as shown in FIG. 7, a metal film 50 is deposited over the contact interlayer insulation film 4. Thus, an identical metal film is buried in the plurality of openings formed in the contact interlayer insulation film 4. For example, the contact holes 44 situated in the memory circuit region and the backing interconnect trenches 42 are buried with the identical metal film. Further, the contact hole 41 and the backing interconnect trench 42 situated in the logic circuit region are buried by the identical metal film. As the method of forming the metal film 50, a method used usually for forming the semiconductor device such as a CVD (Chemical Vapor Deposition) method, a sputtering method, an ALD (Atomic Layer Deposition) method, or the like is used. In this embodiment, description is to be made of a case of using W as the metal film 50.

Figure 8:
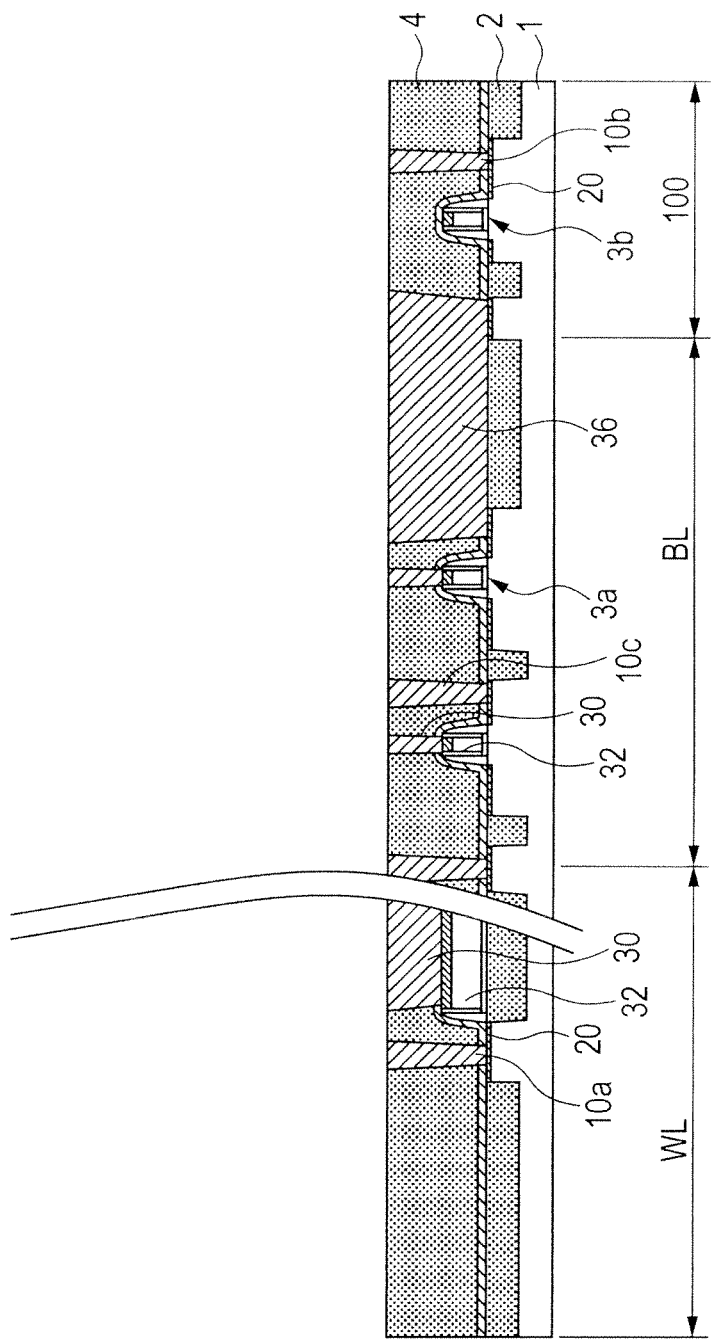
FIG. 8 is a cross sectional step view showing manufacturing procedures of the semiconductor device of the first embodiment.

Successively, as shown in FIG. 8, an excess metal film 50 is removed by a CMP (Chemical Mechanical Polishing) method. Thus, cell contacts 10a and 10b, a gate backing interconnect 30, a bit contact 36 are formed simultaneously in the contact interlayer insulation film 4.

Figure 9:
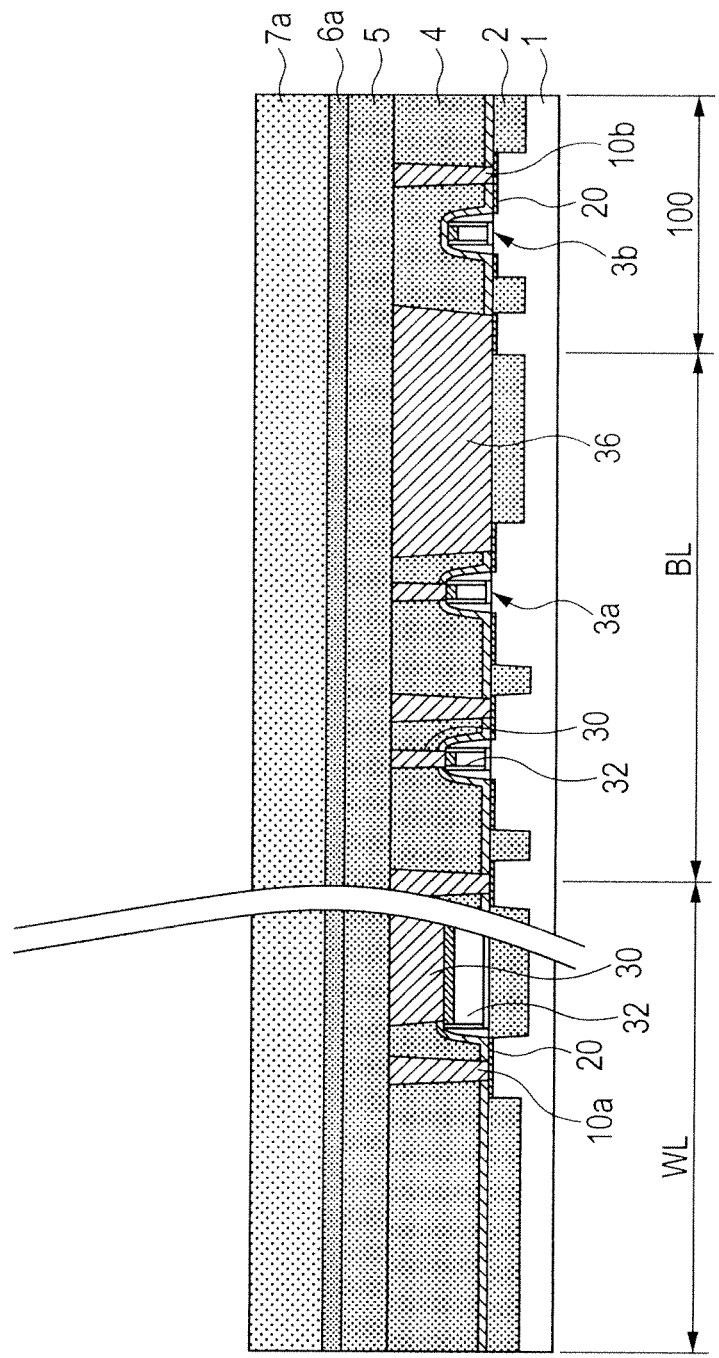
FIG. 9 is a cross sectional step view showing manufacturing procedures of the semiconductor device of the first embodiment.

Successively, as shown in FIG. 9, a contact interlayer insulation film 5, a cap film 6a, and an interlayer insulation film 7a are farmed over the contact interlayer insulation film 4.

Figure 10:
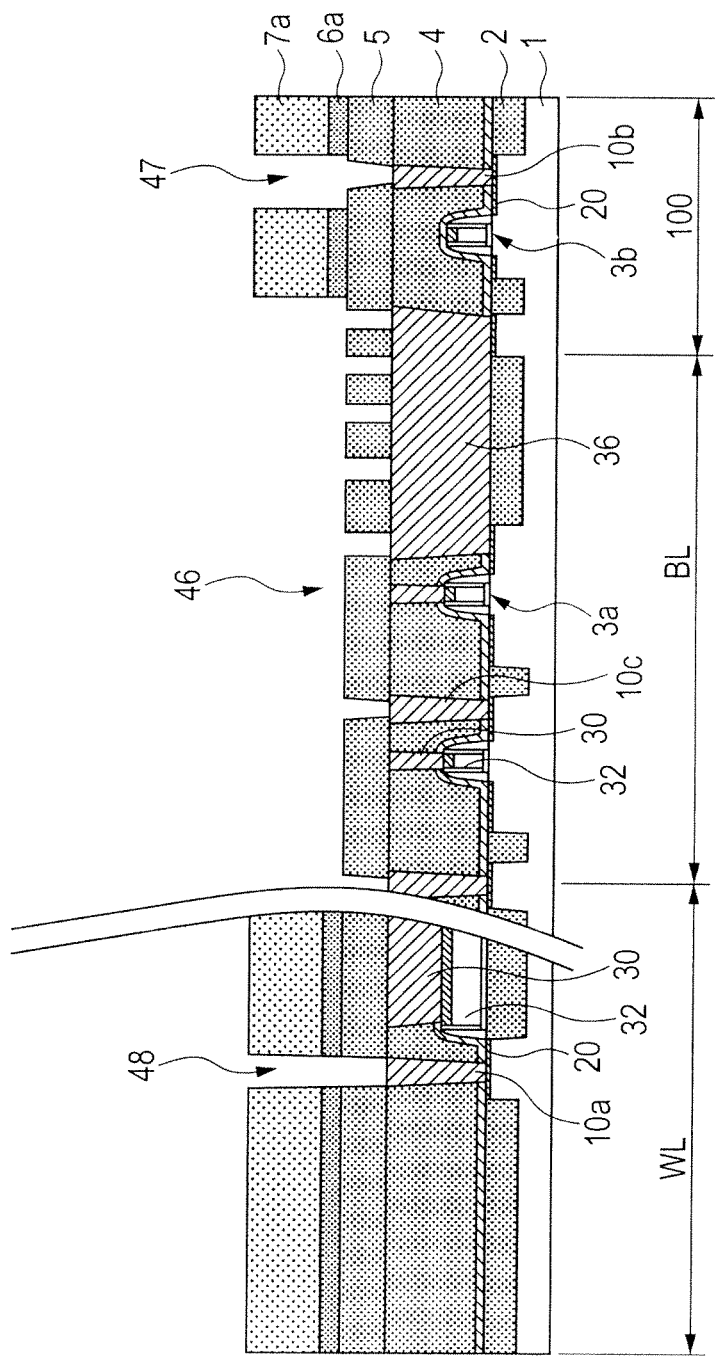
FIG. 10 is a cross sectional step view showing manufacturing procedures of the semiconductor device of the first embodiment.

Successively, as shown in FIG. 10, a bit line trench 46, an interconnect trench 47, and a contact hole 48 are formed in the layers by using photolithography and etching. For forming the pattern of the photoresist corresponding to the openings, a collective exposure method may be used, or the double patterning method described above may also be used. For the collective exposure method, an ArF exposure can be used for instance. Further, for the double patterning method, ArF exposure including liquid immersion ArF exposure, EUV exposure, EB exposure, etc. can be used.

The upper surface of the bit contact 36 and the upper surface of the cell contact 10c are exposed at the bottom of the bit line trench 46. The upper surface of the cell contact 10b is exposed at the bottom of the interconnect trench 47. The upper surface of the cell contact 10a is exposed to the bottom of the contact hole 48. The bit line trench 46, the interconnect trench 47, and the contact hole 48 may be formed simultaneously or may be formed at different timing.

Figure 11:
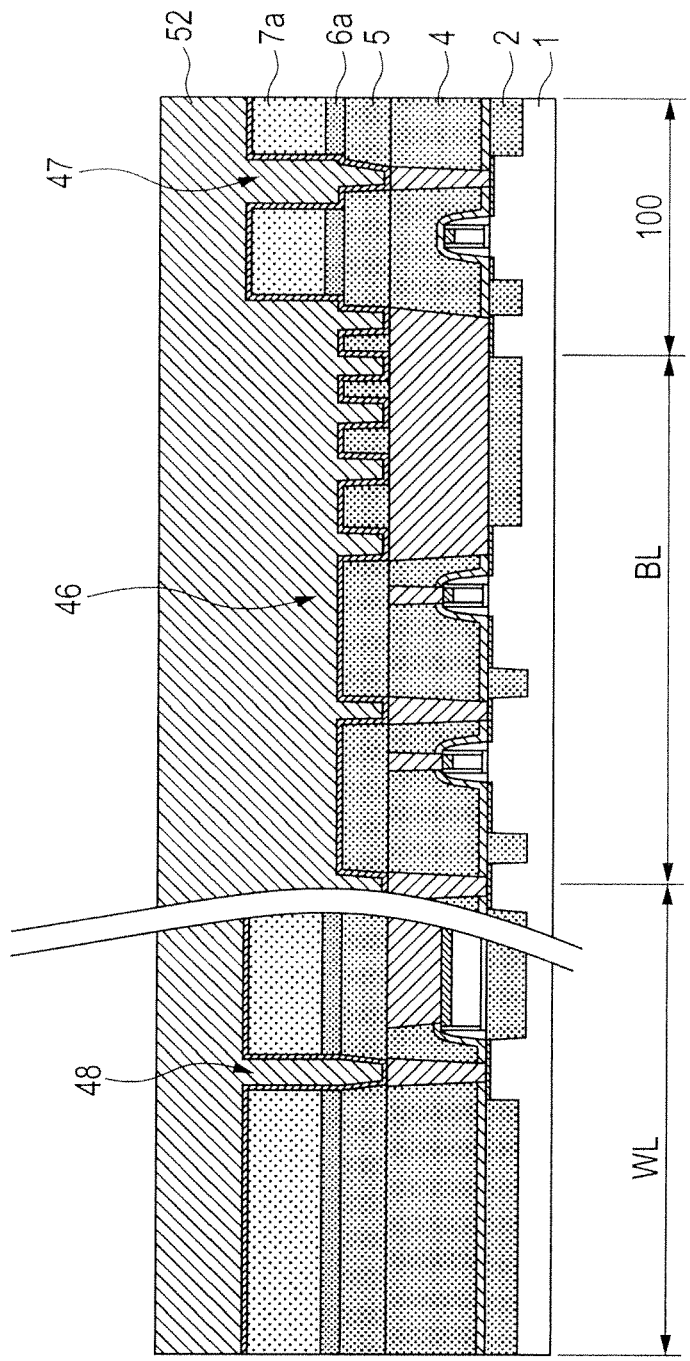
FIG. 11 is a cross sectional step view showing manufacturing procedures of the semiconductor device of the first embodiment.
Figure 12:
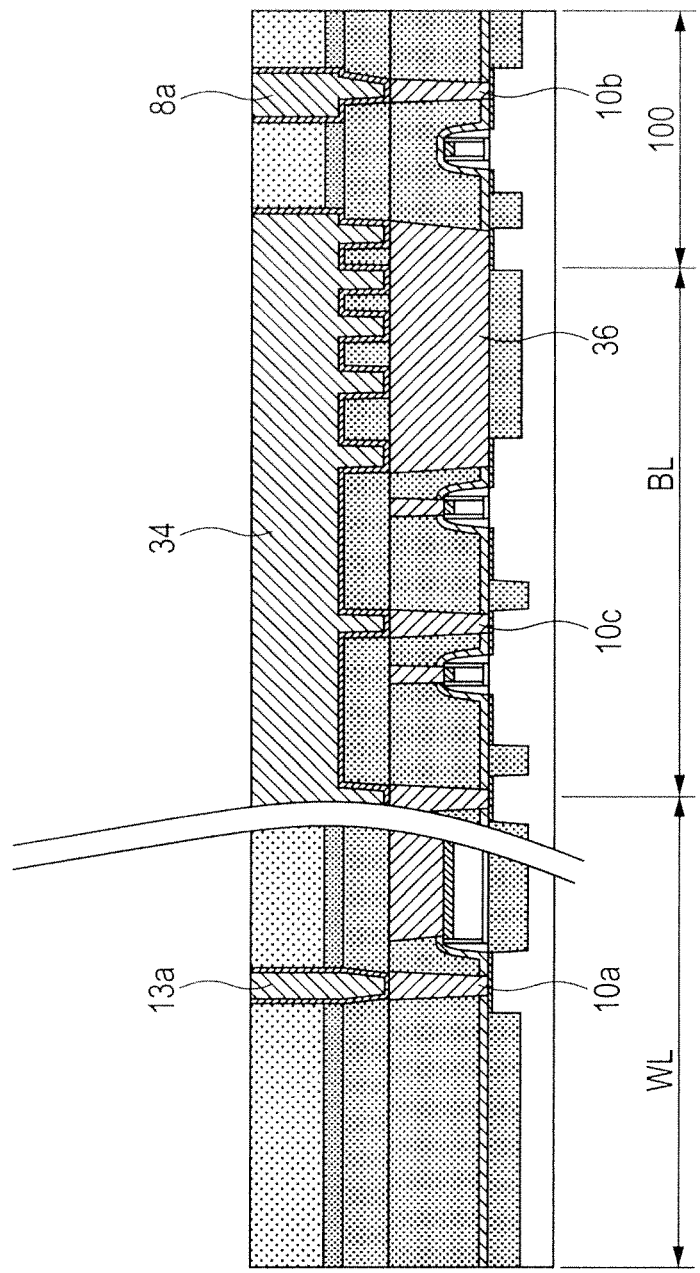
FIG. 12 is a cross sectional step view showing manufacturing procedures of the semiconductor device of the first embodiment.

Successively, as shown in FIG. 11, a barrier metal film and a metal film 52 are deposited in the openings. Successively, as shown in FIG. 12, an excessive metal film is removed by CMP. Thus, a bit line 34, an interconnect 8a, and a capacitance contact 13a are formed. As described above, the bit line 34 or the capacitance contact 13a is formed in the step identical with the interconnect 8a. In this embodiment, description is to be made to a case of using Cu for the metal film 52.

In this embodiment, the bit line 34 can be formed in the memory circuit region by utilizing the interconnect of the logic circuit. Accordingly, the bit line 34 of a height identical with that of the interconnect is formed in the memory circuit region. Thus, even when CMP is performed for the formation of the interconnect, the planarity of the interlayer insulation film 7a at the periphery of the bit line 34 can be ensured.

Figure 13:
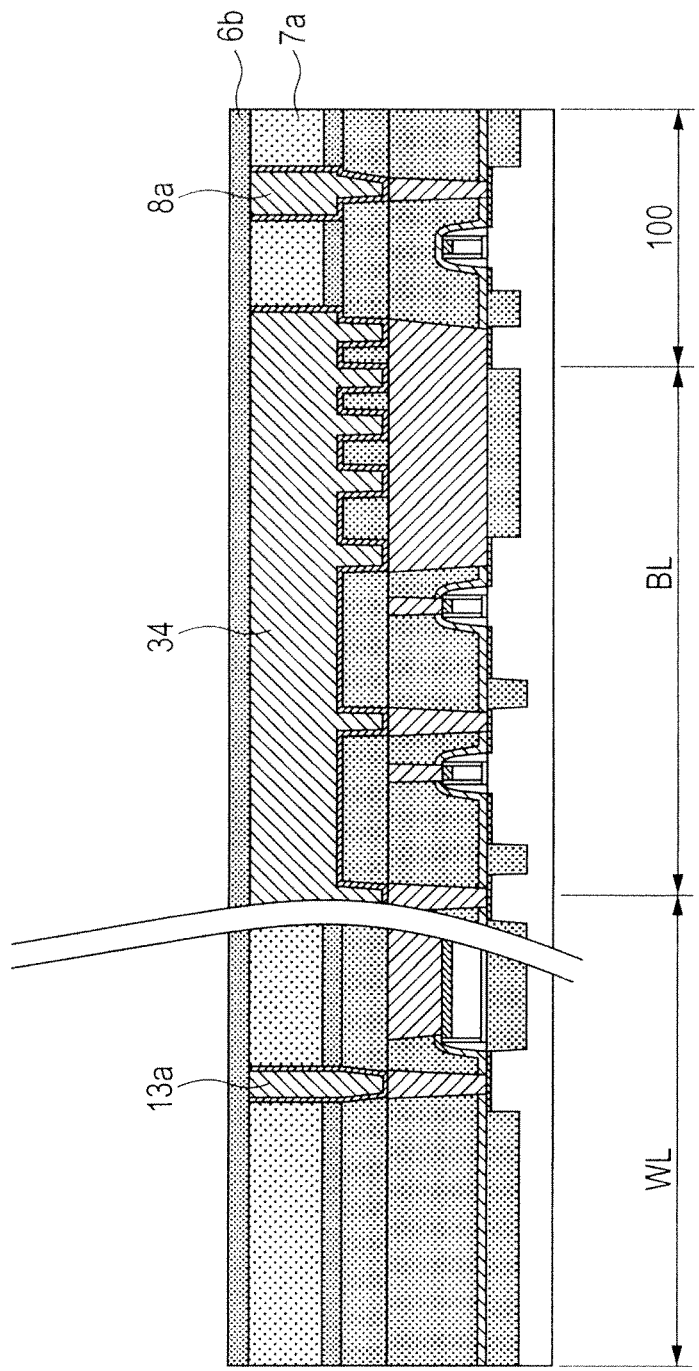
FIG. 13 is a cross sectional step view showing manufacturing procedures of the semiconductor device of the first embodiment.

Successively, as shown in FIG. 13, a cap film 6b is framed over the interlayer insulation film 7a. The upper surfaces of the bit line 34, the interconnect 8a, and the capacitance contact 13a are covered by the cap film 6b.

Figure 14:
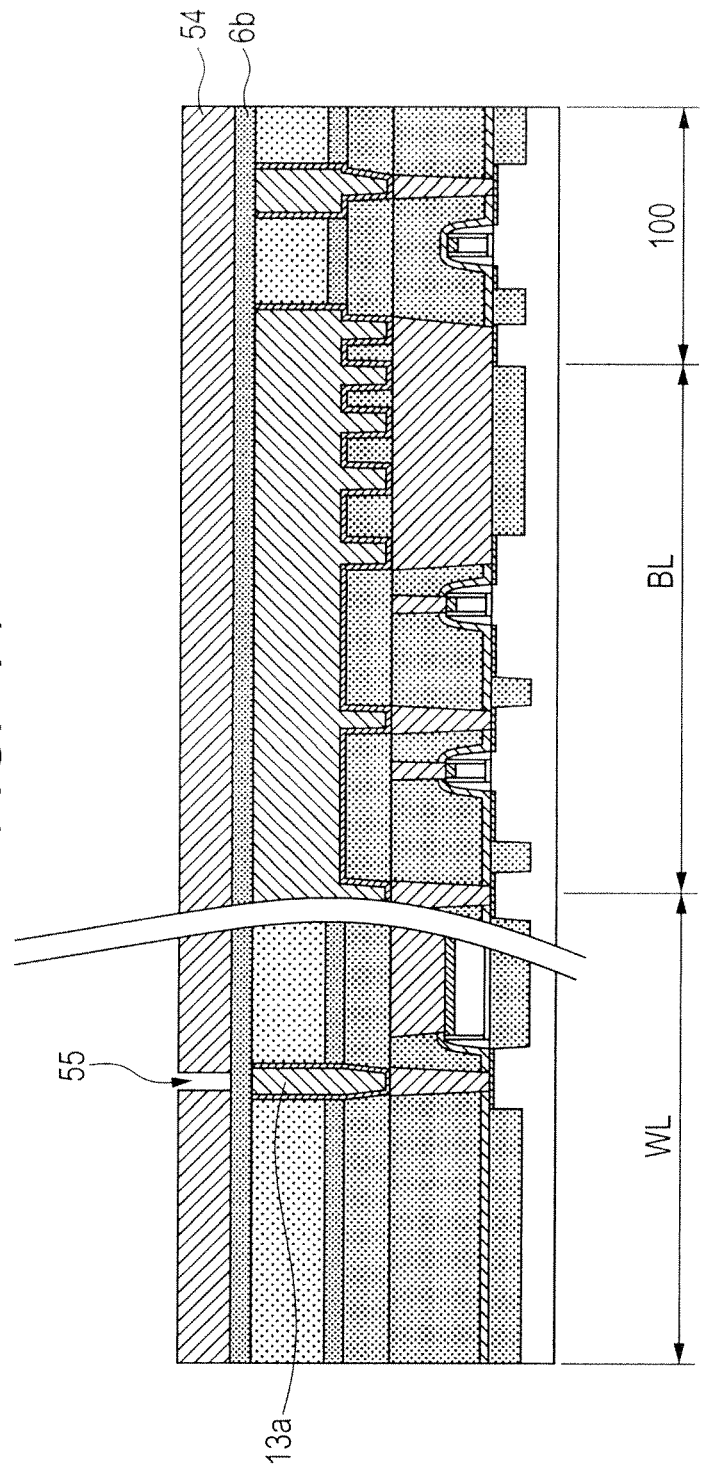
FIG. 14 is a cross sectional step view showing manufacturing procedures of the semiconductor device of the first embodiment.

Successively, as shown in FIG. 14, a photoresist 54 is formed over the cap film 6b. A hole 55 is formed in the photoresist 54.

Figure 15:
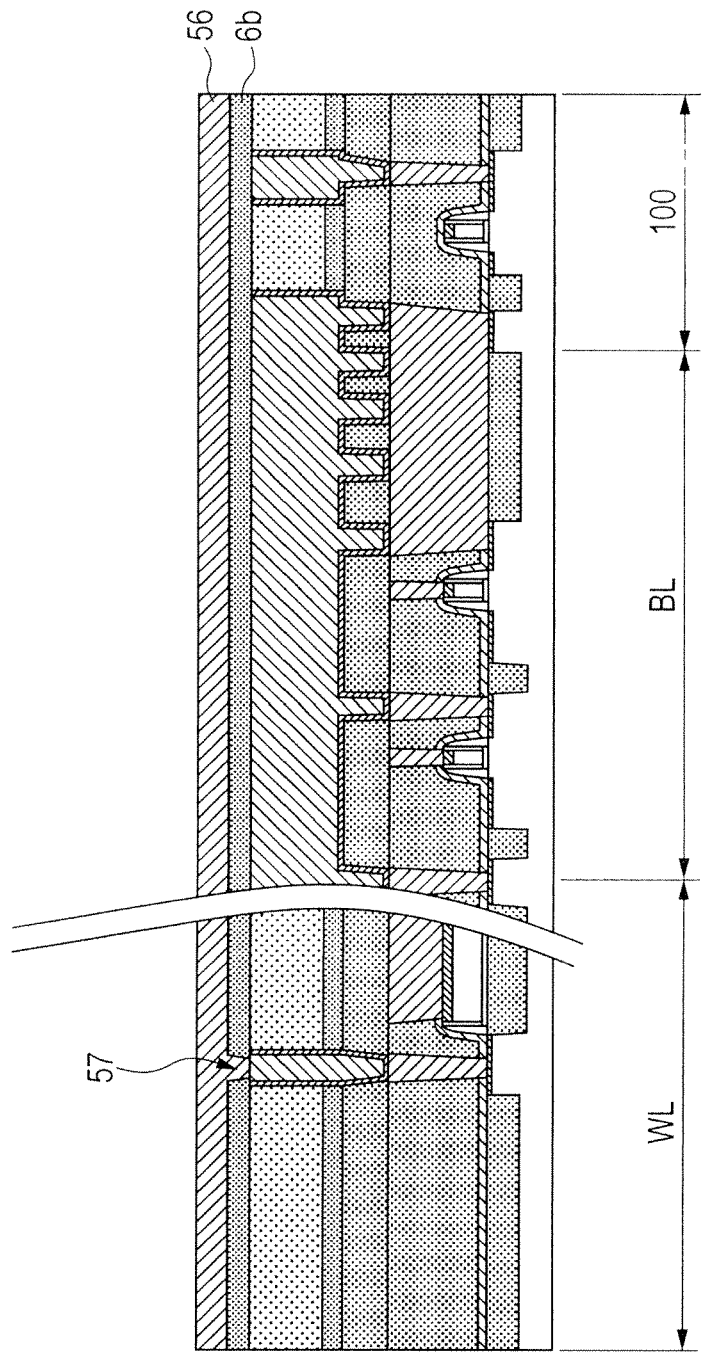
FIG. 15 is a cross sectional step view showing manufacturing procedures of the semiconductor device of the first embodiment.

Successively, as shown in FIG. 15, a via hole 57 is opened by etching or the like. After removing the photoresist 54, a metal film 56 is formed over the cap film 6a. The metal film 56 is buried in the via hole 57. In this embodiment, description is to be made of an example of using, for example, W for the metal film 56. The metal film 56 is deposited, for example, by a CVD method.

Figure 16:
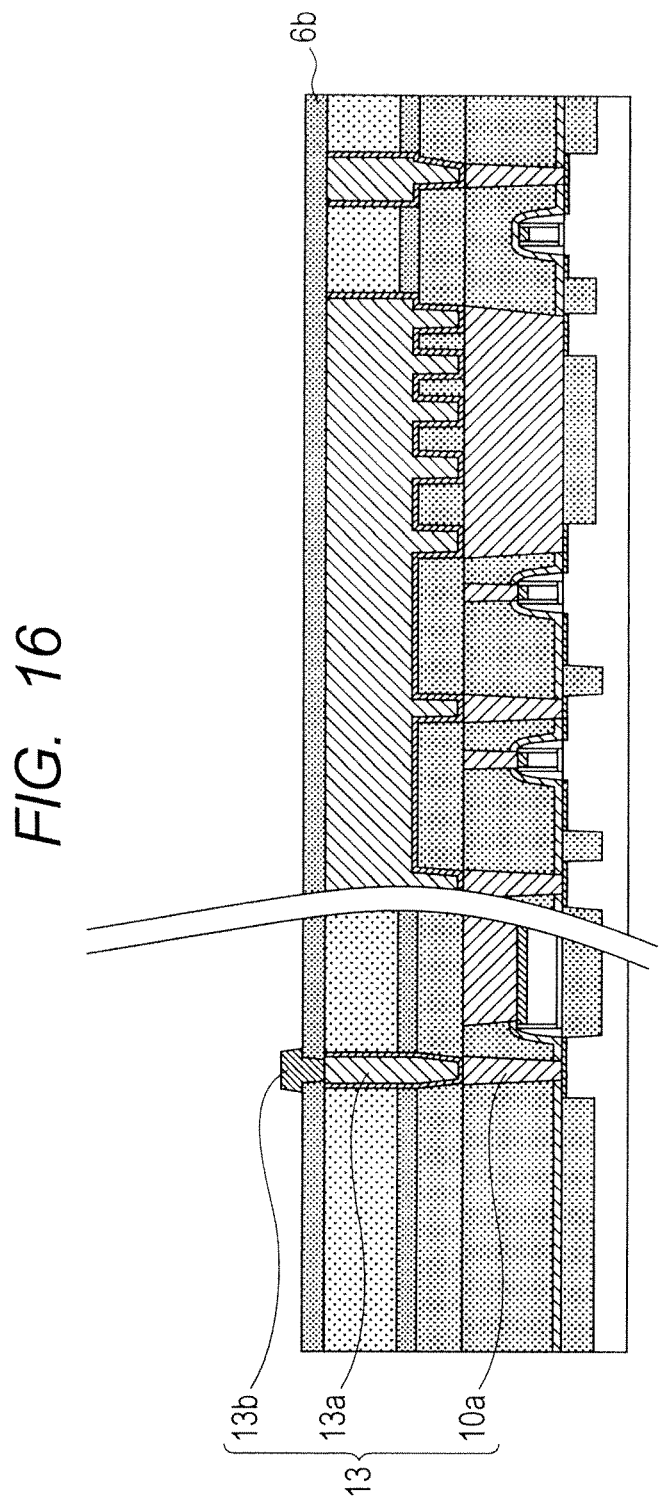
FIG. 16 is a cross sectional step view showing manufacturing procedures of the semiconductor device of the first embodiment.

Successively, as shown in FIG. 16, a protrusion is formed at the top end of the capacitance contact 13b by a reactive ion etching method or the like. The protrusion of the capacitance contact 13 is formed preferably at a position just below a capacitance device 19 formed by subsequent steps.

Subsequent steps for forming interconnects and capacitance devices can be performed in accordance with the method as described in Japanese Unexamined Patent Publication No. 2011-54920. That is, an interlayer insulation film 7b is formed successively over the cap film 6b. An interconnect 8b is formed to the interlayer insulation film 7b by a damascene method used usually.

In this embodiment, protrusions of the capacitance contacts 13 are arranged over the cap film 6b of the memory circuit region. The interlayer insulation film 7b is raised by so much as the height of the protrusions. Thus, when the interlayer insulation film 7b is subjected to CMP in the process of forming the interconnect 8b, degradation of the planarity of the interlayer insulation film 7b in the memory circuit region can be suppressed. This can suppress scattering of the capacitance.

Successively, a cap film 6c is deposited so as to cover at least the upper surface of the interconnect 8b. An interlayer insulation film 7c is deposited over the cap film 6c. An insulation film as a hard mask is deposited over the interlayer insulation film 7c. As the hard mask, an insulation film having higher selectivity to the interlayer insulation films 7b and 7c upon fabricating the interlayer insulation films 7b and 7c is preferred and, for example, a silicon oxide film is preferred. A photoresist is deposited over the hard mask. A pattern for the upper coupling interconnect trench is formed to the photoresist by a method, for example, of photolithography. For the photoresist, either a single layer of a photoresist, or a multilayered photoresist layer including, for example, a planarizing organic film, a silicon oxide film, an antireflection film, and a photoresist may be used.

Successively, an upper coupling interconnect trench is formed in the interlayer insulation film 7c. For example, a fine fabrication method such as reactive ion etching can be used. The height of the upper coupling interconnect trench can be controlled by properly adjusting etching conditions (selectivity, etc.). Then, the photoresist is removed.

Successively, a multilayered resist layer is formed over the interlayer insulation film 7c and over the hard mask in the upper coupling interconnect trench. A concave pattern for burying the capacitance device is formed in the multilayered resist layer by a method, for example, of photolithography.

Successively, a concave portion for burying the capacitance device is formed in the interlayer insulation film 7b, the cap film 6c, and the interlayer insulation film 7c by a fine fabrication method such as reactive ion etching using a multilayered resist layer as a mask. The multilayered resist layer is removed by ashing during fabrication of the concave portion for burying the capacitance device. In this embodiment, at least the upper surface and the lateral wall of the protrusion of the capacitance contact 13b are exposed at the bottom of the concave portion for burying the capacitance device.

In this embodiment, though the concave portion for burying the capacitance device is formed after forming the upper coupling interconnect trench, the concave portion for burying the capacitance device may be formed before forming the coupling interconnect trench.

Successively, a lower electrode 14 is deposited at least on the bottom and on the lateral wall of the upper coupling interconnect trench and the concave portion for burying the capacitance device. For forming the lower electrode 14, a method usually used for the formation of the semiconductor device such as a CVD method, a sputtering method, and an ALD method may be used. Successively, a photoresist is buried inside the concave portion for burying the capacitance device by a coating method or the like. It is preferred that the photoresist is formed to such a height that it remains only in the concave portion for burying the capacitance device but does not reach the upper end of the concave portion for burying the capacitance device. If necessary, an unnecessary photoresist may be removed by performing exposure-development processing to the photoresist. Subsequently, the lower electrode 14 is etched back, for example, by a method of reactive ion etching. Thus, the lower electrode 14 not reaching the upper end of the concave portion for burying the capacitance device can be formed. Then, the photoresist is removed.

Successively, a capacitance dielectric film 15 and an upper electrode 16 are deposited over the lower electrode 14. The capacitance dielectric film 15 and the upper electrode 16 are formed at least over the bottom and the lateral wall of the concave portion for burying the capacitance device, and over the bottom and on the lateral wall of the upper coupling interconnect trench. For the method of forming the capacitance dielectric film 15, a method used usually for forming the semiconductor device such as a CVD method, a sputtering method, and an ALD method can be used. Further, for improving the static capacitance of the capacitance device, an ALD method capable of depositing a thin film of several nm in thickness at good uniformity is more preferred. After depositing the capacitance dielectric film 15, a sintering step may also be performed for improving the crystallinity.

Than, a photoresist is formed inside the concave portion for burying the capacitance device and inside the upper coupling interconnect trench. The resist is formed such that it does not remain over the hard mask that remains in the logic circuit region. If necessary, an unnecessary photoresist formed in the logic circuit region is removed by performing exposure and development processing or performing entirely etching back the photoresist.

Then, the upper electrode 16 and the capacitance dielectric film 15 are etched back by the method, for example, of reactive ion etching. Thus, the upper electrode 16 and the capacitance dielectric film 15 over the hard mask can be removed. Successively, the photoresist is removed by ashing or the like.

Then, an electroconductive hard mask 31 is deposited over the bottom and on the lateral wall of the concave portion for burying the capacitance device and over the bottom and on the lateral wall of the upper coupling interconnect trench. For the hard mask 31, for example, a high melting metal and nitride thereof such as titanium and titanium nitride and tantalum and tantalum nitride, ruthenium, etc., or stacked structures thereof may be used. As a method of forming the hard mask 31, a method usually used for forming the semiconductor device, for example, a CVD method, a sputtering method, or an ALD method may be used. The hard mask 31 preferably has a thickness sufficient to perform subsequent fabrication for the logic circuit interconnect. However, since the hard mask 31 may sometimes remain as the upper electrode of the capacitance device 19, the hard mask preferably has a low electric resistance. That is, the hard mask 31 remaining inside the concave portion for burying the capacitance device functions as the upper electrode. Accordingly, the hard mask 31 may be set to such a thickness that it is eliminated after fabrication of the logic circuit interconnect to be described later. That is, as the material of the hard mask 31, a material identical with that of the upper electrode 16 can be used. The hard mask 31 and the upper electrode 16 may include identical or different type of material and it is more preferred that they include an identical material.

Then, an interconnect trench for burying an interconnect 8c is formed in the logic circuit region. In the interconnect forming step, the hard mask 31 may be removed by reactive ion etching or the like after forming the opening. By using the method, the thickness of the hard mask 31 remaining inside the capacitance device 19 can be reduced to lower the resistance value of the upper electrode of the capacitance device.

Then, a barrier metal 17 and an electroconductive film are buried in the concave portion for burying the capacitance device, the upper coupling interconnect trench, and the interconnect trench. The electroconductive film may include a metal containing Cu, W or Al and, among them, the conductive film preferably includes a Cu-containing material. Then, the electroconductive film, the barrier metal film, and the hard mask are removed by the method, for example, of a CMP method. Thus, the capacitance device 19, the upper coupling interconnect 18, and the interconnect 8c are formed. While the upper coupling interconnect 18 and the interconnect 8c are preferably formed by an identical step, they may be formed by separate steps. That is, the upper coupling interconnect 18 may include a material identical with that of the metal film of the interconnect 8c or may include a different material. In this embodiment, the interconnect trench is formed after forming the concave portion for burying the capacitance device, but this order is not restrictive and the concave portion for burying the capacitance device may be formed after burying the metal film in the interconnect trench.

Figure 17:
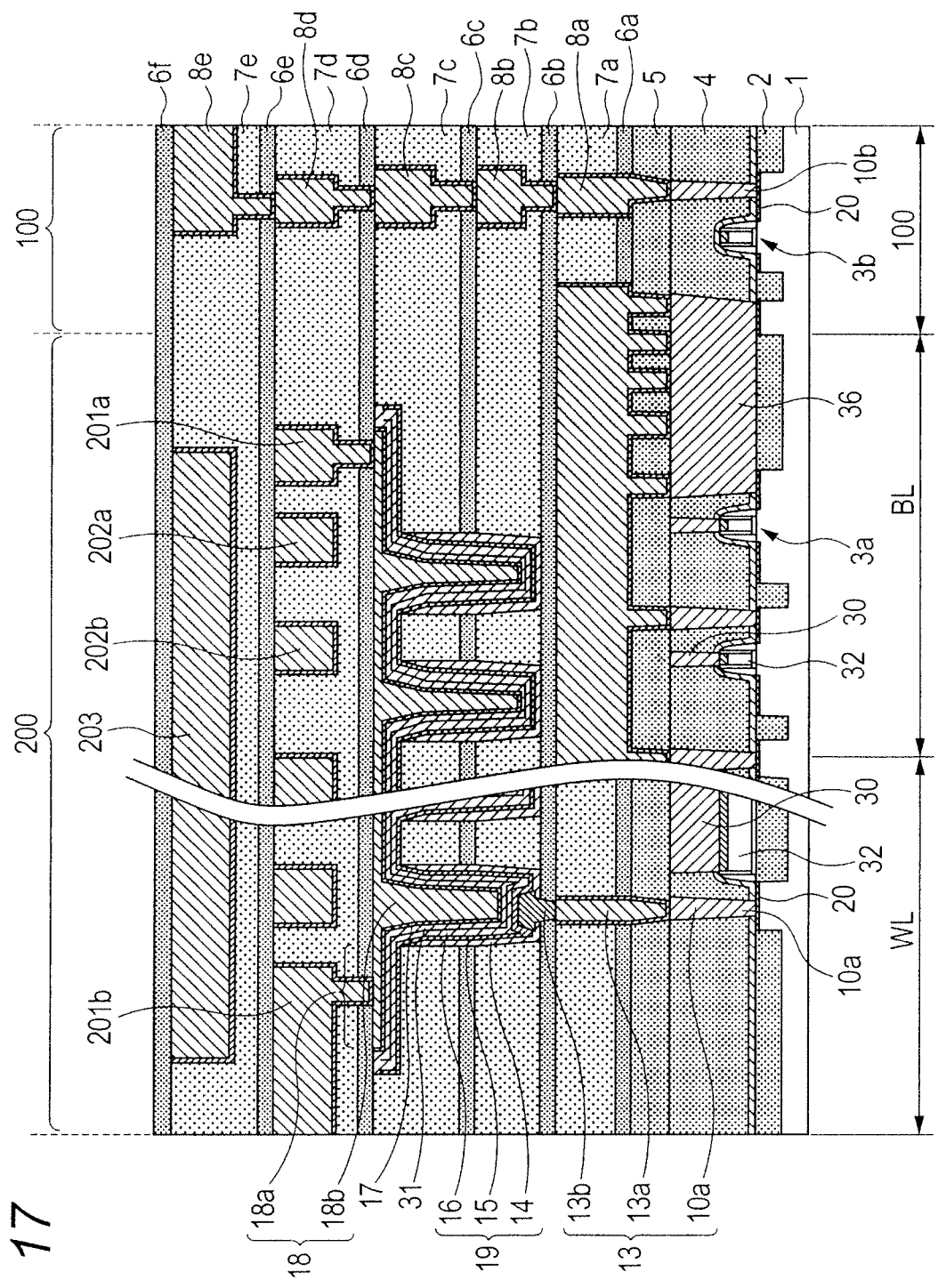
FIG. 17 is a cross sectional step view showing manufacturing procedures of the semiconductor device of the first embodiment.

Then, as shown in FIG. 17, a cap film 6d is formed over the upper surface of the upper coupling interconnect 18 and over the upper surface of the interconnect 8c. Then, an interlayer insulation film 7d, a cap film 6e, an interlayer insulation film 7e, and a cap film 6f are formed over the cap film 6d. Further, interconnects 8d, 8e, interconnects 201a and 201b having a fixed potential, signal interconnects 202a and 202b, and a power supply-ground interconnect 203 are formed in respective insulation films. With the procedures described above, a semiconductor device of the first embodiment is obtained.

Second Embodiment

Figure 18:
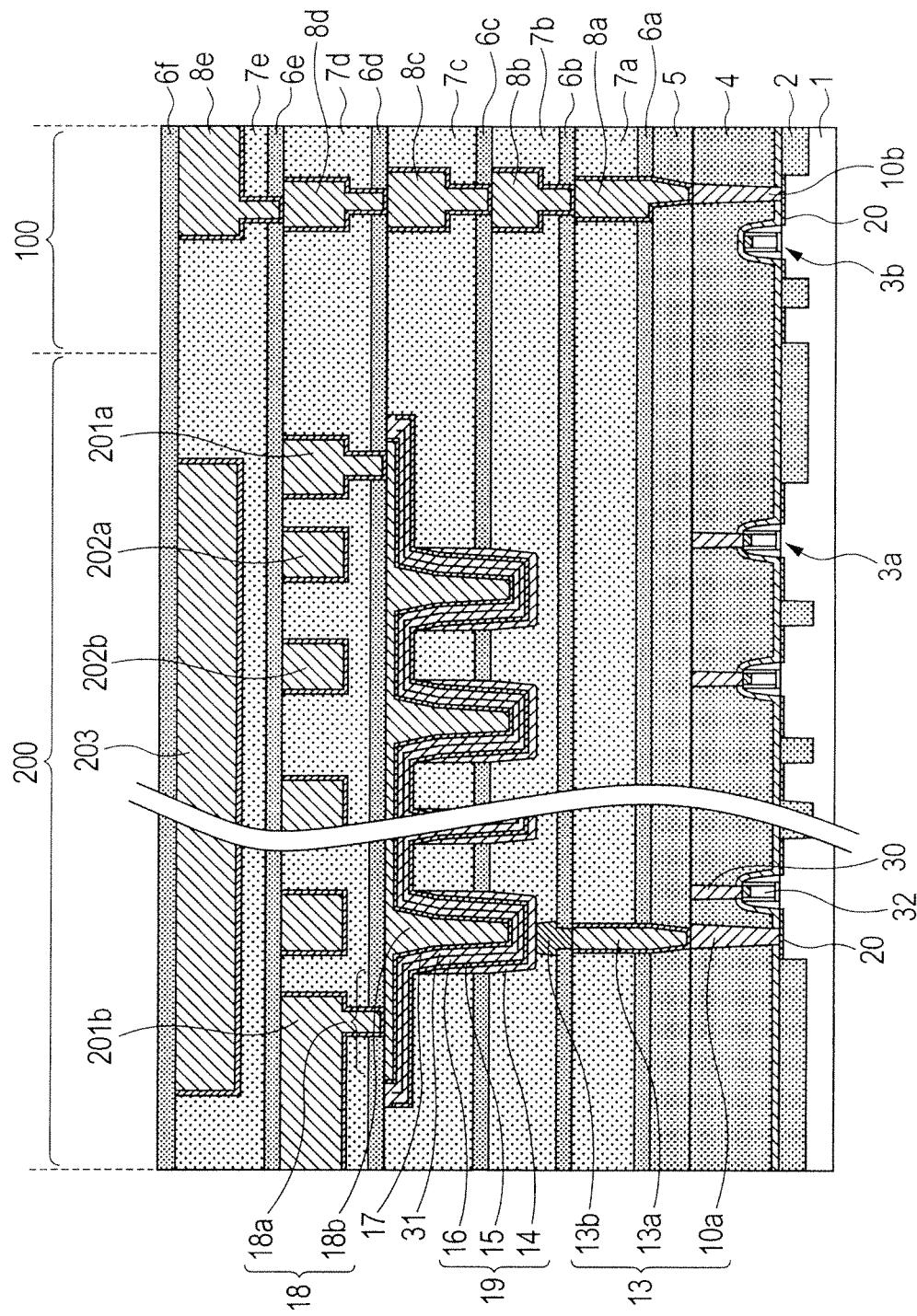
FIG. 18 is a cross sectional view schematically showing the semiconductor device of a second embodiment.

Then, a semiconductor device according to a second embodiment is to be described. FIG. 18 is a cross sectional view schematically showing a semiconductor device of the second embodiment. The second embodiment is identical with the first embodiment except that an interlayer insulation film 7b is present between the lower end of the capacitance device 19 and the cap film 6b. This is to be described specifically.

The lower end of the capacitance device 19 is preferably in contact at least with the upper surface of the capacitance contact 13. For example, the lower end of the capacitance device 19 may be at a position identical with the lower end of the interconnect portion of the interconnect 8b situated in an identical layer. In other words, the bottom of the concave portion for burying the capacitance device may form a surface identical with the bottom of the interconnect trench of the interconnect layer in an identical layer. Further, a stopper film may be formed at the periphery of the bottom of the concave portion for burying the capacitance device. Control for the position of the bottom of the concave portion for burying the capacitance device can thus be facilitated.

In the second embodiment, the distance between the lower end of the capacitance device 19 and the bit line 34 can be increased compared with the case where the lower end of the capacitance device 19 is in contact with the cap film 6b. This can suppress increase in the parasitic capacitance between the capacitance device 19 and the bit line 34.

The method of manufacturing the semiconductor device according to the second embodiment is different from the first embodiment in that the former has the following steps. That is, a cap layer (cap film 6a) is formed at first over the interlayer insulation layer (contact interlayer insulation film 4). Then, an insulation layer (interlayer insulation film 7b) is formed over the cap film 6a. Then, a concave portion (concave portion for burying the capacitance device) not reaching the cap film 6b is formed in the interlayer insulation film 7b. Subsequently, a capacitance device 19 is buried in the concave portion.

In the step of forming the concave portion, at least the upper surface of the capacitance contact 13b is exposed at the bottom of the concave portion for burying the capacitance device. On the other hand, the lower layer of the interlayer insulation film 7b is not exposed to the bottom of the concave portion for burying the capacitance device. The underlayer is, for example, the cap film 6a. The depth of the concave portion for burying the capacitance device can be controlled depending on the etching condition or by forming a stopper film at the intermediate of the interlayer insulation film 7b.

Third Embodiment

Then, a semiconductor device according to a third embodiment is to be described.

Figure 19:
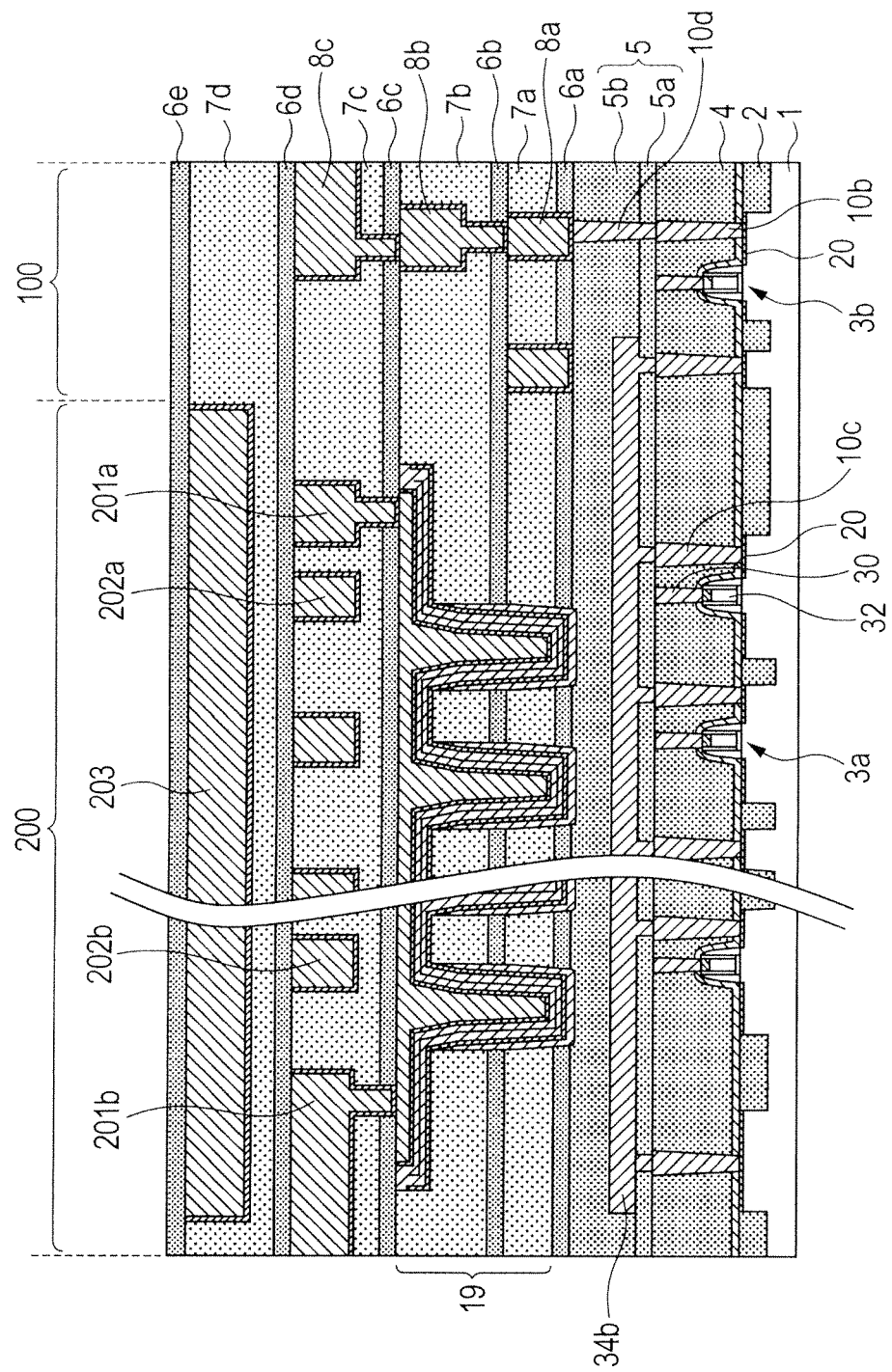
FIG. 19 is a cross sectional view schematically showing a semiconductor device of a third embodiment.

FIG. 19 is a cross sectional view schematically showing the semiconductor device according the third embodiment.

The third embodiment is identical with the first embodiment except that the contact layer is formed in the logic circuit region in a layer identical with the bit line 34b. This is to be described specifically.

In the logic circuit region, a contact layer is formed between the contact interlayer insulation film 4 and the first interconnect layer (lowermost interconnect layer). The contact layer has a cell contact 10b buried in the contact interlayer insulation film 5. The cell contact 10d electrically couples the first interconnect (interconnect 8a) and the cell contact 10b. The cell contact 10b is coupled to the diffusion layer of the transistor (active device 3b) in the logic circuit region.

On the other hand, a bit line 34b is formed in a layer identical with the contact layer. The bit line 34b preferably includes a W-containing metal. The material for the bit line 34b is different from that of the interconnect 8a (for example, Cu interconnect). The upper surface of the bit line 34b is formed lower than the upper surface of the interconnect 8a. In other words, the upper end of the bit line 34b and the cap film 6a are isolated from each other and a contact interlayer insulation film 5b is disposed between them. In this embodiment, the bit line 34b can be formed, for example, by etching fabrication.

In this embodiment, since the distance between the lower end of the capacitance device 19 and the bit line 34b can be ensured more effectively than in the first embodiment, increase in the parasitic capacitance between them can be suppressed.

Further, since the gate backing interconnect 30 is formed in the same layer as the word line (gate electrode 32) while in contact therewith, the degree of freedom for the design of the interconnect layer over the capacitance device 19 can be enhanced while decreasing the resistance of the word line.

As a matter of fact, a plurality of embodiments described above can be combined with each other within a range not conflicting to each other with respect to the contents thereof. Further, in the embodiments described above, structures for each of portions, etc. are described specifically but the structures, etc. can be modified variously within a range capable of satisfying the present invention.

What is claimed is:

1. A semiconductor device comprising:
a substrate;
a first interlayer insulation layer disposed over the substrate;
first transistors disposed over the substrate and buried in the first interlayer insulation layer;
a multilayered interconnect layer disposed over the first interlayer insulation layer, wherein a second interlayer insulation layer of the multilayered interconnect layer is disposed over the first interlayer insulation layer, and a third interlayer insulation layer of the multilayered interconnect layer is disposed over the second interlayer insulation layer;
capacitance devices disposed in third interlayer insulation layer of the multilayered interconnect layer above the second interlayer insulation layer;
a gate electrode and a diffusion layer of each of the first transistors;
a metal interconnect in contact with the upper surface of the gate electrode, extended in a direction identical with the gate electrode and buried in the first interlayer insulation layer;
first contacts coupled to the diffusion layer of the first transistor and buried in the first interlayer insulation layer, wherein the metal interconnect includes a material identical with that of the first contact;
second transistors disposed over the substrate and situated in a logic circuit region which is a region different from a memory circuit region including the first transistors;
a second contact for coupling the second transistor with a first interconnect,
wherein the first interconnect is situated in the lowermost interconnect layer of the second interlayer insulation layer of the multilayered interconnect layer and extends entirely through the second interlayer insulation layer, the lowermost interconnect layer and the second contact being disposed below the capacitance devices, and
wherein the second contact includes a material identical with that of the metal interconnect; and
bit lines situated in the memory circuit region, disposed in the layer identical with the first interconnect, and coupled to the diffusion layer of each of the first transistors, the bit lines arranged entirely below the capacitance devices and extending entirely through the second interlayer insulation layer.

2. The semiconductor device according to claim 1, wherein the metal interconnect includes a W-containing material.

3. The semiconductor device according to claim 1, wherein the bit line includes a material identical with that of the first interconnect.

4. The semiconductor device according to claim 1, comprising:
a capacitance contact for coupling the first transistor and the capacitance device,
wherein the lower electrode of the capacitance device covers the upper surface and at least the upper portion of the lateral wall of the capacitance contact.

5. The semiconductor device according to claim 4, wherein the capacitance contact has at least three or more contacts arranged in the direction of penetrating the interlayer.

6. A method of manufacturing a semiconductor device comprising:
forming first transistors each having a gate electrode and a first diffusion layer to a substrate;
forming a first interlayer insulation layer over the first transistors;
forming interconnect trenches extended in the direction identical with that of the gate electrode to the first interlayer insulation layer over the gate electrode and forming first contact holes for burying a contact in the first interlayer insulation layer over the first diffusion layer;
burying an identical metal layer in the interconnect trenches and in the first contact holes;
forming an insulation layer having a second interlayer insulation layer over the first interlayer insulation layer and a third interlayer insulation layer over the second interlayer insulation layer;
burying capacitance devices in the third interlayer insulation layer above the second interlayer insulation layer;
forming second transistors each having a second diffusion layer to the substrate situated in a logic circuit region which is a region different from a memory circuit region including the first transistors;
forming the first interlayer insulation layer over the second transistors;
forming second contact holes to the first interlayer insulation layer over the second diffusion layer for burying contacts;
burying an identical metal layer in the second contact holes and the interconnect trenches; and
removing excess metal to form contacts in the second contact holes below the capacitance devices;
forming a first interconnect of a lowermost interconnect layer extending entirely through the second interlayer insulation layer; the lowermost interconnect layer being disposed below the capacitance devices; and
forming bit lines situated in the memory circuit region in the second interlayer insulation layer, and coupled to the first diffusion layer of each of the first transistors, the bit lines arranged entirely below the capacitance devices and extending entirely through the second interlayer insulation layer.

7. The semiconductor device according to claim 1, wherein a top surface of the first interlayer insulation film, the metal interconnect, the first contacts, and the second contact are at a same height above the substrate.

* * * * *